United States Patent
Chang et al.

(10) Patent No.: US 6,633,068 B2
(45) Date of Patent: Oct. 14, 2003

(54) LOW-NOISE SILICON CONTROLLED RECTIFIER FOR ELECTROSTATIC DISCHARGE PROTECTION

(75) Inventors: Chyh-Yih Chang, Taipei (TW); Ming-Dou Ker, Hsinchu (TW); Hsin-Chin Jiang, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 84 days.

(21) Appl. No.: 09/852,234

(22) Filed: May 10, 2001

(65) Prior Publication Data

US 2002/0167052 A1 Nov. 14, 2002

(51) Int. Cl.$^7$ ............................................. H01L 23/62
(52) U.S. Cl. ....................... 257/355; 257/350; 257/335
(58) Field of Search ................................ 257/577, 107, 257/335, 350, 355

(56) References Cited

U.S. PATENT DOCUMENTS

| | | |
|---|---|---|
| 4,939,616 A | 7/1990 | Rountree |
| 5,012,317 A | 4/1991 | Rountre |
| 5,225,702 A | 7/1993 | Chatterjee |
| 5,453,384 A | 9/1995 | Chatterjee |
| 5,465,189 A | 11/1995 | Polgreen et al. |
| 5,502,328 A | 3/1996 | Chen et al. |
| 5,519,242 A | 5/1996 | Avery |
| 5,581,104 A | 12/1996 | Lowrey et al. |
| 5,629,544 A | 5/1997 | Voldman et al. |
| 5,631,793 A | 5/1997 | Ker et al. |
| 5,646,808 A | 7/1997 | Nakayama |
| 5,654,862 A | 8/1997 | Worley et al. |
| 5,719,737 A | 2/1998 | Maloney |
| 5,754,381 A | 5/1998 | Ker |
| 5,807,791 A | 9/1998 | Bertin et al. |
| 5,811,857 A | 9/1998 | Assaderaghi et al. |
| 5,907,462 A | 5/1999 | Chatterjee et al. |
| 5,910,874 A | 6/1999 | Iniewski et al. |
| 5,932,918 A | 8/1999 | Krakauer |
| 5,940,258 A | 8/1999 | Duvvury |
| 5,990,520 A | 11/1999 | Noorlag et al. |
| 6,015,992 A | 1/2000 | Chatterjee et al. |
| 6,034,397 A | 3/2000 | Voldman |
| 6,074,899 A * | 6/2000 | Voldman ..................... 438/155 |
| 6,081,002 A | 6/2000 | Amerasekera et al. |
| 6,242,763 B1 * | 6/2001 | Chen et al. .................. 257/107 |
| 2002/0033520 A1 * | 3/2002 | Kunikiyo .................... 257/577 |

OTHER PUBLICATIONS

N. K. Verghese and D. Allstot, "Verification of RF and Mixed–Signed Integrated Circuits for Substrate Coupling Effects", in *Proc. of IEEE Custom Integrated Circuits Conf.*, 1997, pp. 363–370.

M.Xu, D. Su, D. Shaeffer, T.Lee, and B. Wooley, "Measuring and Modeling the Effects of Substate Noise on LNA for a CMOS GPS Receiver, "*IEEE Journal of Solid–State Circuits*, vol. 36, pp. 473–485, 2001.

(List continued on next page.)

Primary Examiner—Vu A. Le
Assistant Examiner—Brad Smith
(74) Attorney, Agent, or Firm—Finnegan, Henderson, Farabow, Garrett & Dunner, L.L.P.

(57) ABSTRACT

An integrated circuit device that includes a semiconductor substrate, a well region formed inside the semiconductor substrate, a first isolation structure contiguous with the well region, a second isolation structure contiguous with well region and spaced apart from the first isolation structure, a dielectric layer disposed over the well region and the first and second isolation structures, and a layer of silicon, formed over the dielectric layer, including a first p-type portion, a first n-type portion contiguous with the first p-type portion, a second p-type portion, and a second n-type portion contiguous with the second p-type portion, wherein at least a portion of the first p-type and first n-type portions overlap the first isolation structure and at least a portion of the second p-type and second n-type portions overlap the second isolation structure.

46 Claims, 22 Drawing Sheets

OTHER PUBLICATIONS

R. Gharpurey, "A Methodology for Measurement and Characterization of Substrate Noise in High Frequency Circuits," in *Proc. of IEEE Custom Integrated Circuits Conf.*, 1999, pp. 487–490.

M. Nagata, J. Nagai, K. Hijikata, T. Morie, and A. Iwata, "PhysicalDesign Guides for Substrate Noise Reduction in CMOS Digital Circuits," *IEEE Journal of Solid–State Circuits*, vol. 36, pp. 539–549, 2001.

M.–D. Ker, T–Y, Chen, C–Y. Wu, and H.–H. Chang, "ESD Protection Design on Analog Pin With Very Low Input Capacitance for High–Frequency or Current–Mode Applications," *IEEE Journal of Solid–State Circuits*, vol. 35, pp. 1194–1199, 2000.

M.–D. Ker, "Whole–Chip ESD Protection Design with Efficient VDD–to–VSS ESD Clamp Circuit for Submicron CMOS VLSI," *IEEE Trans. on Electron Devices*, vol. 46, pp. 173–183, 1999.

M–D. Ker, et al., "CMOS On–Chip ESD Protection Design with Substrate–triggering Technique," Proc. of ICECS, vol. 1, pp. 273–276, 1998.

C. Duvvury et al., "Dynamic Gate Coupling for NMOS for Efficient Output ESD Protection", Proc. of IRPS, pp. 141–150, 1992.

C. Richier, P. Salome, G. Mabboux, I. Zara, A. Juge, and P. Mortini, "Investigation on Different ESD Protection Strategies Devoted to 3.3V RF Applications (2 (GHz) in a 0.18μm CMOS Process, " in Proc. EOS/ESD Symp., 200, pp. 251–259.

T.–Y. Chen and M.–D. Ker, "Design on ESD Protection Circuit With Low and Constant Input Capacitance," in *Proc. of IEEE Int. Symp. on Quality Electronic Design, 2001*, pp. 247–247.

M.–D. Ker, T.–Y. Chen, C.–Y. Wu, and H.–H. Chang, "ESD Protection Design on Analog Pin With Very Low Input Capacitance for RF or Current–Mode Applications," *IEEE Journal of Solid–State Circuits*, vol. 35, pp. 1194–1199, 2000.

S. Voldman, et al. , "Semiconductor Process and Structural Optimization of Shallow Trench Isolation–Defined and Polysilicon– Bound Source/Drain Diodes for ESD Networks," in Proc. of EOS/ESD Symp., 1998, 1998, pp. 151–160.

S. Voldman, et al., "Analysis of Snubber–Clamped Diode–String Mixed Voltage Interface ESD Protection Network for Advanced Microprocessors," in Proc. of EOS/ESD symposium, 1995, pp. 43–61.

M.J. Pelgrom, et al., "A 3/5 V Compatible I/O Buffer," IEEE Journal of Solid–State Circuits, vol. 30, No. 7, pp. 823–825, Jul. 1995.

G.P. Singh, et al., "High–Voltage–Toleant I/OBuffers with Low–Voltage CMOS Process," IEEE Journal of Solid–State Circuits, vol. 34, No. 11, pp. 1512–1525, Nov. 1999.

H. Sanchez, et al., "A Versatile 3.3/2.5/1.8–V CMOS I/O Driver Built in 02. –μm, 3.5–nm Tox, 1.8 –V CMOS Technology," IEEE Journal of Solid–State Circuits, vol. 34 No. 11.pp. 1501–1511, Nov. 1999.

\* cited by examiner

LOW-NOISE SILICON CONTROLLED RECTIFIER FOR ELECTROSTATIC DISCHARGE PROTECTION

BACKGROUND OF THE INVENTION

1. Field of the Invention

This invention pertains in general to a semiconductor device, and, more particularly, to a low-noise silicon controlled rectifier.

2. Description of the Related Art

A semiconductor integrated circuit (IC) is generally susceptible to an electrostatic discharge (ESD) event, which may damage or destroy the IC. An ESD event refers to a phenomenon of electrical discharge of a current (positive or negative) for a short duration during which a large amount of current is provided to the IC. The high current may be built-up from a variety of sources, such as the human body. Many schemes have been implemented to protect an IC from an ESD event. Examples of known ESD protection schemes are shown in FIGS. 1 and 2. In deep-submicron complementary metal-oxide semiconductor (CMOS) process technology with shallow-trench isolations (STIs), a silicon controlled rectifier (SCR) has been used for ESD protection. An important feature of an SCR is its voltage-holding ability. An SCR can sustain high current and hold the voltage across the SCR at a low level, and may be implemented to bypass high current discharges associated with an ESD event.

FIG. 1 is a reproduction of FIG. 3 of U.S. Pat. No. 5,012,317 to Rountre, entitled "Electrostatic Discharge Protection Circuit." Rountre describes a lateral SCR structure made up of a P$^+$ type region 48, an N-type well 46, a P-type layer 44, and an N$^+$ region 52. According to Rountre, a positive current associated with an ESD event flows through region 48 to avalanche a PN junction between well 46 and layer 44. The current then flows from layer 44 to region 52 across the PN junction and ultimately to ground, to protect an IC from the ESD event. However, an inherent disadvantage of the SCR structure shown in FIG. 1 is susceptibility to being accidentally triggered by a substrate noise, resulting in device latch-up.

FIG. 2 is a reproduction of FIG. 8B of U.S. Pat. No. 5,754,381 (the '381 patent) to Ker, one of the inventors of the present invention. The '381 patent is entitled "Output ESD Protection with High-Current-Triggered Lateral SCR" and describes a modified PMOS-trigger lateral SCR (PTLSCR) structure and NMOS-trigger lateral SCR (NTLSCR) structure. The '381 patent describes an NTLSCR 44 modified by an addition of a parasitic junction9-diode 66. The '381 patent describes that the modified PTLSCR or NTLSCR structure prevents an SCR from being triggered by a substrate noise current, thereby preventing device latch-up.

SUMMARY OF THE INVENTION

Accordingly, the present invention is directed to a low-noise silicon controlled rectifier substantially and a substrate-biased low-noise silicon controlled rectifier that obviate one or more of the problems due to limitations and disadvantages of the related art.

Additional features and advantages of the invention will be set forth in the description which follows, and in part will be apparent from the description, or may be learned by practice of the invention. The objectives and other advantages of the invention will be realized and attained by the structures and methods particularly pointed out in the written description and claims thereof, as well as the appended drawings.

To achieve these and other advantages, and in accordance with the purpose of the invention as embodied and broadly described, there is provided an integrated circuit device that includes a semiconductor substrate, a dielectric layer disposed over the semiconductor substrate, and a layer of silicon, formed over the dielectric layer, including a first p-type portion, a first n-type portion contiguous with the first p-type portion, a second p-type portion, and a second n-type portion contiguous with the second p-type portion, wherein the first p-type portion, the second p-type portion, the first n-type portion, and the second n-type portion overlap the isolation structure.

In one aspect of the invention, the first n-type portion is contiguous with the second p-type portion.

In another aspect of the invention, the layer of silicon further comprises a center portion disposed between the first n-type portion and the second p-type portion.

In yet another aspect of the invention, the layer of silicon further comprises a third n-type portion contiguous with the first p-type portion.

In still another aspect of the invention, the layer of silicon further comprises a fourth n-type portion contiguous with the first p-type portion and the first n-type portion, wherein the fourth n-type portion has a doped concentration lower than that of the third n-type portion.

Also in accordance with the present invention, there is provided an integrated circuit device that includes a semiconductor substrate, an isolation structure formed inside the semiconductor substrate, and a layer of silicon, formed over the isolation structure, including a first p-type portion, a first n-type portion contiguous with the first p-type portion, a center portion contiguous with the first n-type portion, a second p-type portion contiguous with the center portion, and a second n-type portion contiguous with the second p-type portion, wherein the first p-type portion, the second p-type portion, the center portion, the first n-type portion, and the second n-type portion overlap the isolation structure.

In one aspect of the invention, the center portion of the layer of silicon is doped with an n-type impurity having a doped concentration lower than that of the first n-type portion.

In another aspect of the invention, the center portion of the layer of silicon is undoped.

Further in accordance with the present invention, there is provided an integrated circuit device that includes a semiconductor substrate, a well region formed inside the semiconductor substrate, a first isolation structure, formed inside the semiconductor substrate, contiguous with the well region, a second isolation structure, formed inside the semiconductor substrate, contiguous with a well region and spaced apart from the first isolation structure, a dielectric layer disposed over the well region and the first and second isolation structures, and a layer of silicon, formed over the dielectric layer, including a first p-type portion, a first n-type portion contiguous with the first p-type portion, a second p-type portion, and a second n-type portion contiguous with the second p-type portion, wherein at least a portion of the first p-type and first n-type portions overlap the first isolation structure and at least a portion of the second p-type and second n-type portions overlap the second isolation structure.

In one aspect of the invention, the well region is biased to control the layer of silicon for providing electrostatic discharge protection.

Additionally in accordance with the present invention, there is provided an integrated circuit device that includes a semiconductor substrate, an insulator layer disposed over the semiconductor substrate, a first silicon layer disposed over the insulator layer including a first isolation structure formed inside the first silicon layer, and a second isolation structure formed inside the first silicon layer and spaced apart from the first isolation structure. The integrated device also includes a dielectric layer disposed over the first silicon layer, and a second layer of silicon, disposed over the dielectric layer, including a first p-type portion, a first n-type portion contiguous with the first p-type portion, a second p-type portion, and a second n-type portion contiguous with the second p-type portion.

In one aspect of the invention, the portion of the first silicon layer between the first and second isolation structures is biased to provide electrostatic discharge protection.

Also in accordance with the present invention, there is provided a method for protecting a complementary metal-oxide semiconductor device from electrostatic discharge that includes providing a signal to the device through a complementary metal-oxide semiconductor circuit, providing a low-noise silicon controlled rectifier in the complementary metal-oxide semiconductor circuit, isolating the low-noise silicon controlled rectifier from a substrate of the complementary metal-oxide semiconductor circuit, and protecting the device from electrostatic discharge produced from the signal with the low-noise silicon controlled rectifier.

Further in accordance with the present invention, there is provided a method for protecting a silicon-on-insulator device from electrostatic discharge that includes providing a signal to the device through a silicon-on-insulator circuit, providing a low-noise silicon controlled rectifier in the silicon-on-insulator circuit, isolating the low-noise silicon controlled rectifier from a substrate of the silicon-on-insulator circuit, and protecting the device from electrostatic discharge with the low-noise silicon controlled rectifier.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are incorporated in and constitute a part of this specification, illustrate embodiments of the invention and, together with the description, serve to explain the objects, advantages, and principles of the invention.

In the drawing.

DETAILED DESCRIPTION OF THE PREFERRED EMBODIMENTS

In accordance with the present invention, there is provided an SCR formed in a silicon layer for ESD protection. The SCR may also be formed in a polysilicon layer (PSCR). The SCR or PSCR of the present invention is disposed over shallow trench isolations (STIs) and is therefore electrically isolated from the substrate. Accordingly, the SCR or PSCR of the present invention insensitive to substrate noise. In one embodiment, the SCR or PSCR may be biased from the substrate for an improved trigger speed of the SCR or PSCR. Although the embodiments the SCR of the present invention are generally described as having been formed in a layer of polysilicon, i.e., PSCR, one skilled in the art would understand that the SCR of the present invention may also be formed in a layer of silicon.

Figure 1:
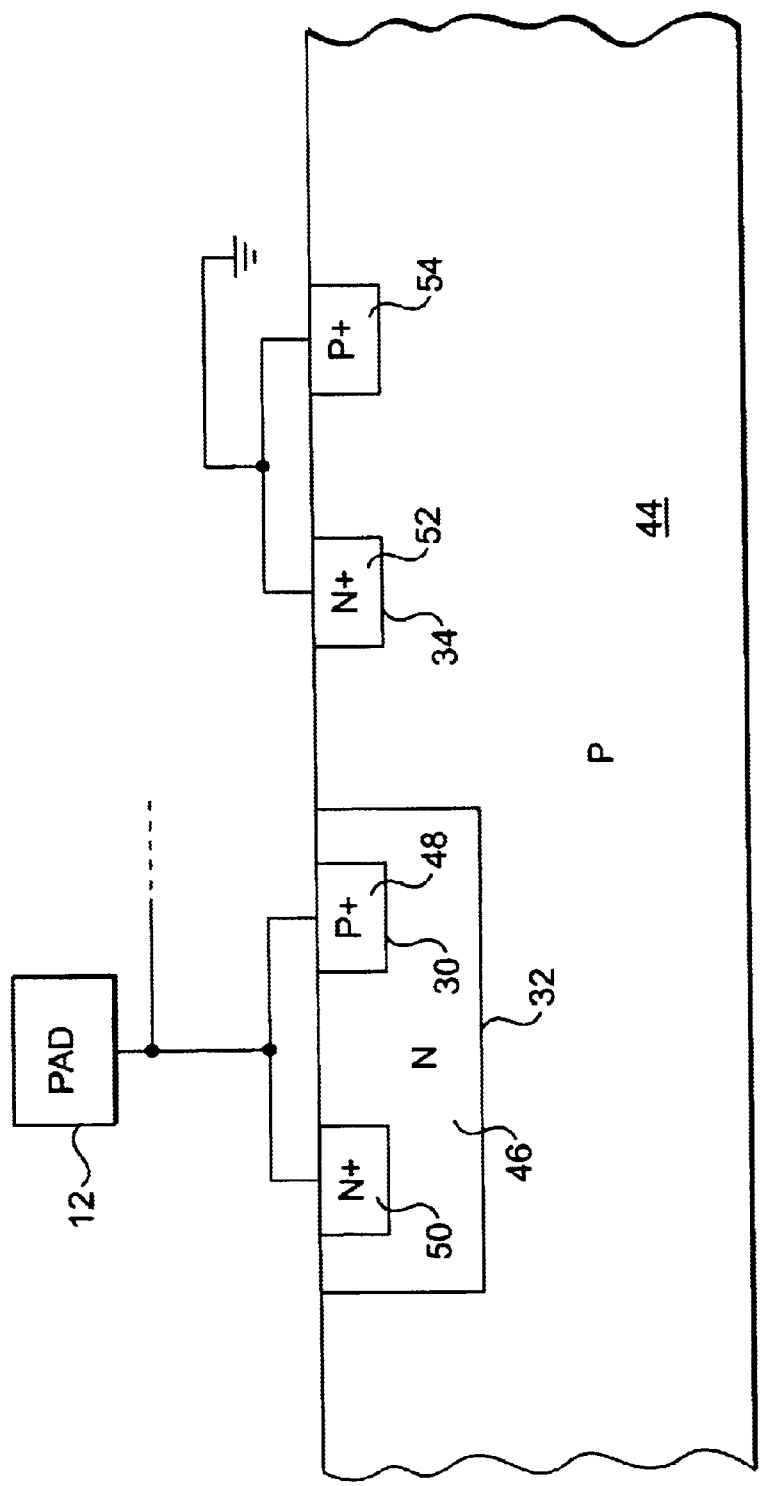
FIG. 1 shows a cross-sectional view of a known silicon controlled rectifier structure formed in an integrated circuit.
Figure 2:
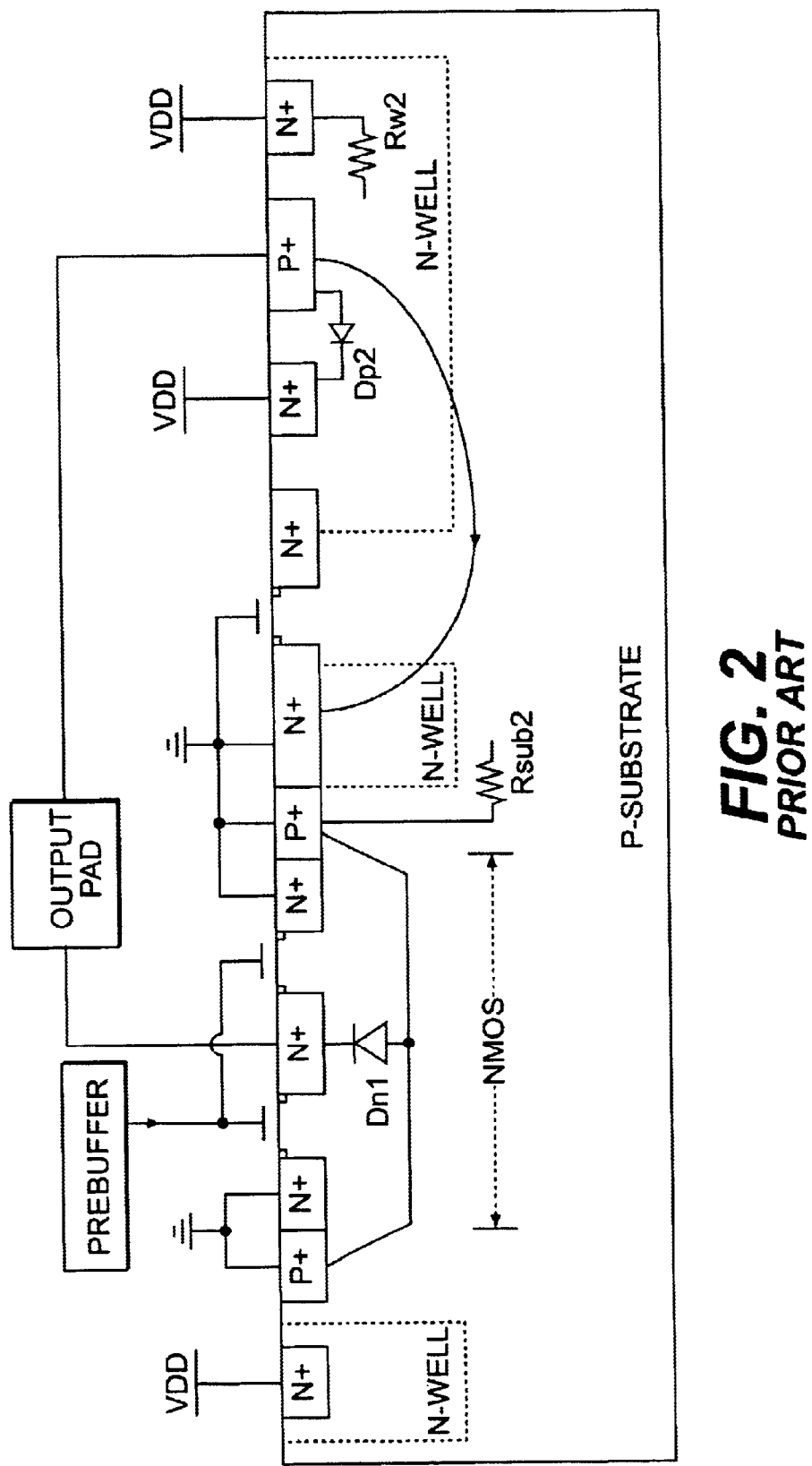
FIG. 2 shows a cross-sectional view of another known silicon controlled rectifier structure formed in an integrated circuit.
Figure 3:
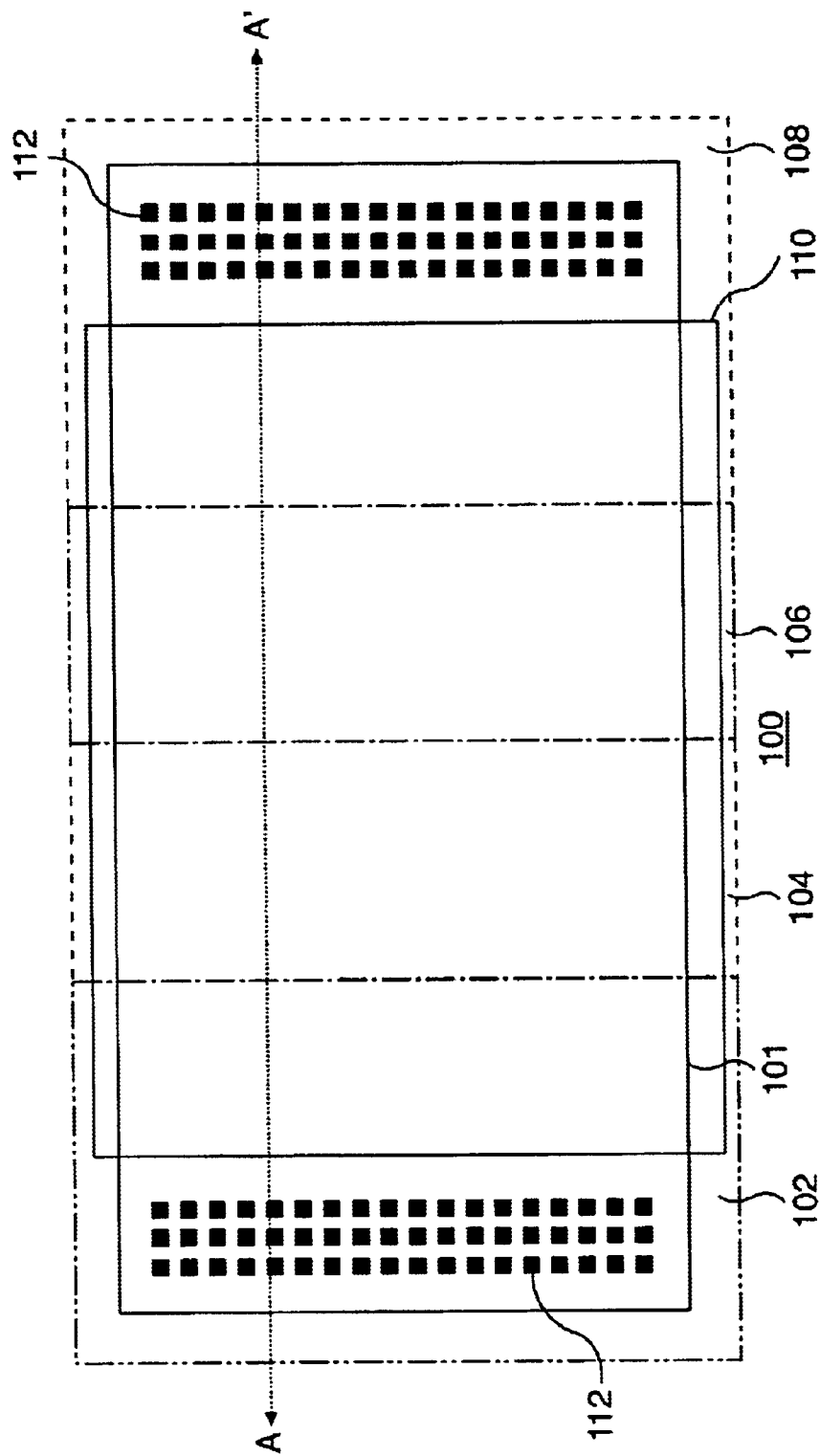
FIG. 3 shows a layout of an SCR structure in accordance with one embodiment of the present invention.

FIG. 3 shows a layout of a PSCR structure in accordance with one embodiment of the present invention. Referring to FIG. 3, a PSCR 100 includes a first p-type portion 102, a first n-type portion 104 formed contiguous with the first p-type portion 102, a second p-type portion 106 formed contiguous with the first n-type portion 104, and a second n-type portion 108 formed contiguous with the second p-type portion 106. The PSCR 100 is formed in a polysilicon layer 101. A plurality of contacts 112 separately connect the first p-type region 102 and the second n-type region 108 of the PSOR 100. A resistance protection oxide (RPO) layer 110 may be formed over the PSCR 100 to prevent polycide growth on the PSCR 100. The RPO layer 110 does not overlap the contacts 112. A cross-sectional view of the PSCR 100 along the A–A' direction is shown in FIG. 4.

Figure 4:
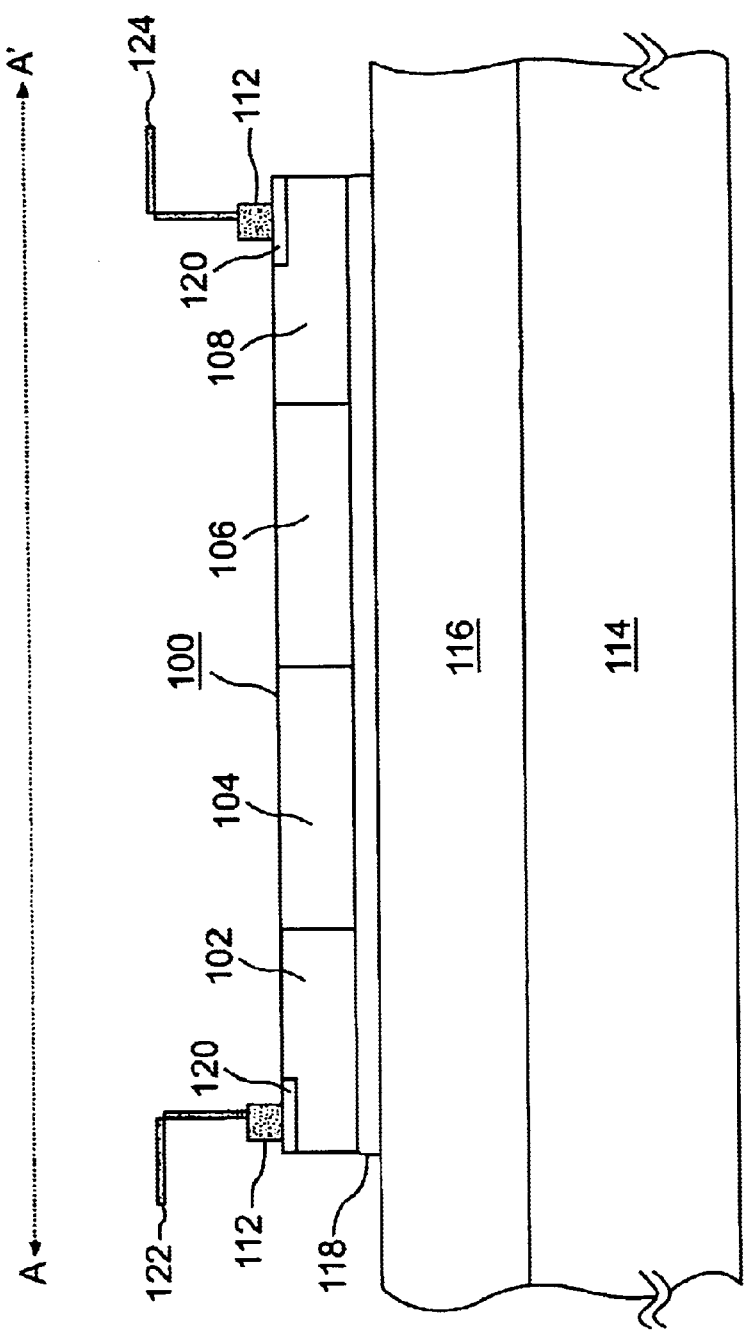
FIG. 4 shows a cross-sectional view of the SCR structure shown in FIG. 3.

Referring to FIG. 4, the PSCR 100 is disposed over a dielectric layer 118. The dielectric layer 118 may be a gate dielectric layer and is disposed over an STI region 116 formed in a semiconductor substrate 114. In one embodiment of the invention, the semiconductor substrate 114 is a p-type substrate. Polycide layers 120 are formed over a portion of the first p-type portion 102 and the second n-type portion 108. The contacts 112 are formed over the polycide layers 120 and establish electrical connection with the PSCR 100. Specifically, an anode 122 is connected to the first p-type portion 102 of the PSCR 100 and a cathode 124 is connected to the second n-type portion 108 of the PSCR 100. The PSCR 100 is electrically isolated from the semiconductor substrate 114 and therefore immune from substrate noise.

Figure 5:
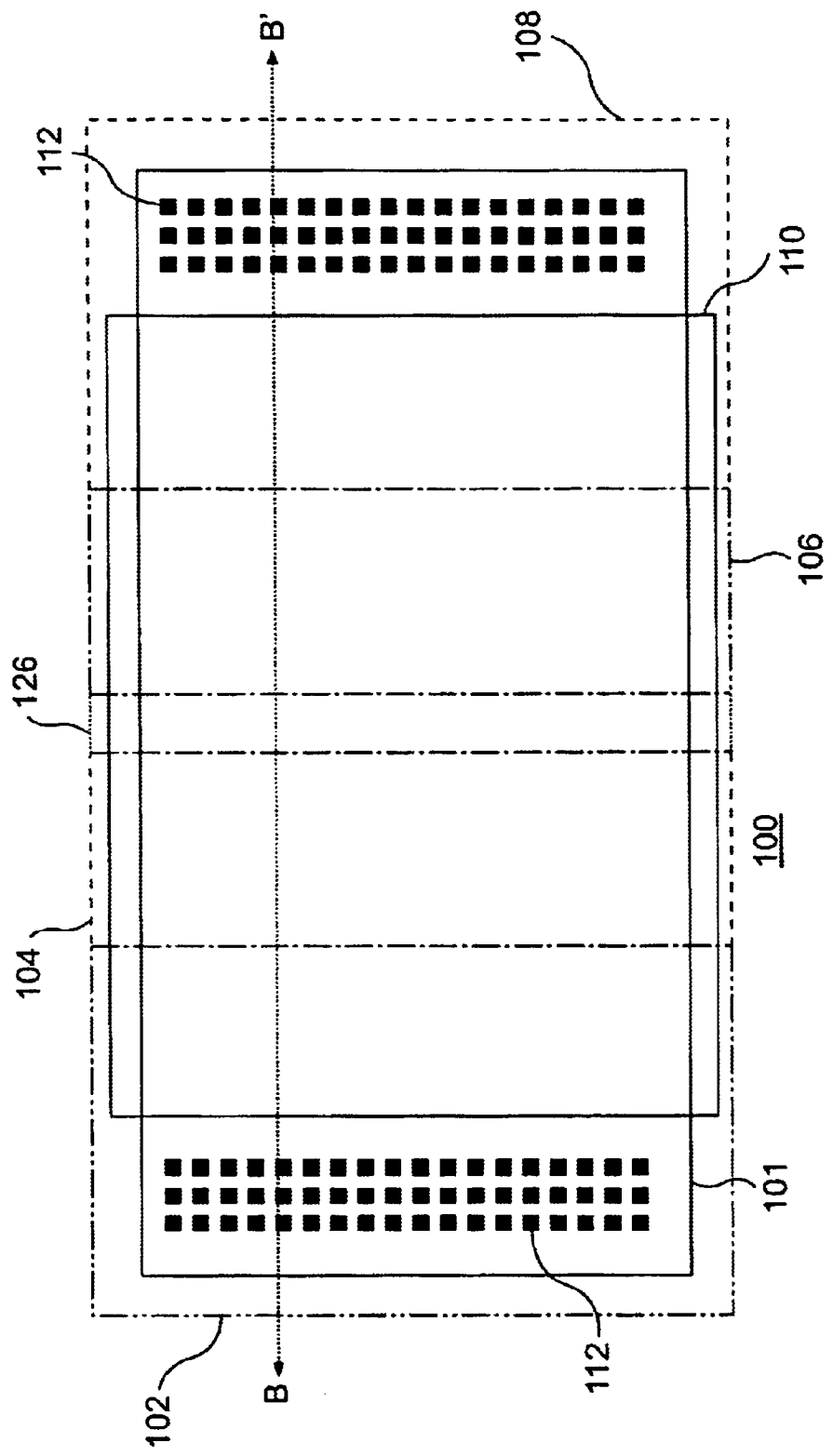
FIG. 5 shows a layout of an SCR structure in accordance with another embodiment of the present invention.

FIG. 5 shows a layout of a PSCR structure in accordance with another embodiment of the present invention. Referring to FIG. 5, the PSCR 100 additionally includes a center portion 126. The center portion 126 is disposed between and contiguous with the first n-type portion 104 and the second p-type portion 106. In one embodiment, the center portion 126 is doped with an n-type dopant and has a doped concentration lower than either of the first n-type portion 104 or the second n-type portion 108. In another embodiment, the center portion 126 is doped with a p-type dopant and has a doped concentration lower than either of the first p-type portion 102 or the second p-type portion 106. In yet another embodiment, the center portion 126 is undoped. The PSCR 100 with the center portion 126 suppresses junction leakage current of the PSCR 100 due to the difference in dopant concentration levels across the center portion 126. A cross-sectional view of the PSCR 100 along the B–B' direction is shown in FIG. 6.

Figure 6:
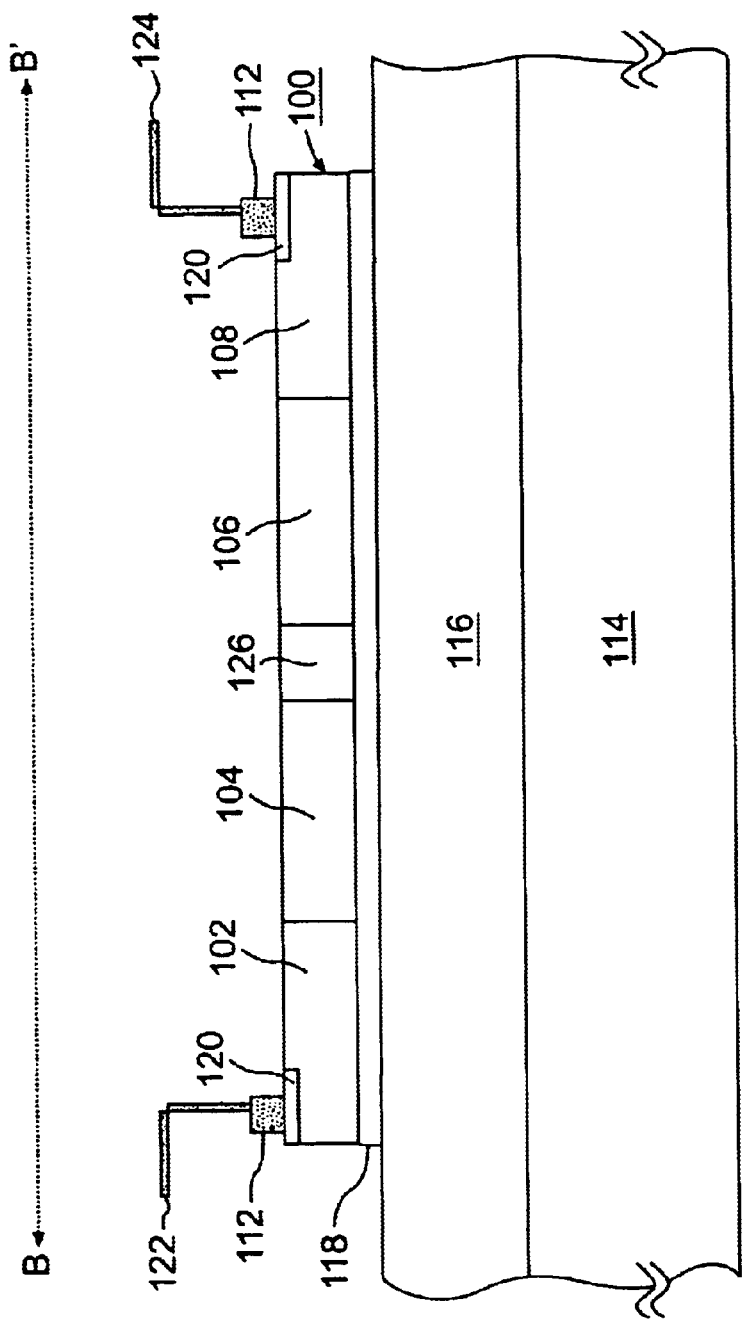
FIG. 6 shows a cross-sectional view of the SCR structure shown in FIG. 5.

Referring to FIG. 6, the PSCR 100 is disposed over a dielectric layer 118. The dielectric layer 118 is disposed over an STI region 116 formed in a semiconductor substrate 114. Polycide layers 120 are formed over a portion of the first p-type portion 102 and the second n-type portion 108. The contacts 112 are formed over the polycide layers 120 and establish electrical connection with the PSCR 100. An anode 122 is connected to the first p-type portion 102 of the PSCR 100 and a cathode 124 is connected to the second n-type portion 108 of the PSCR 100. The PSCR 100 is electrically isolated from the semiconductor substrate 114 and therefore immune from substrate noise.

Figure 7:
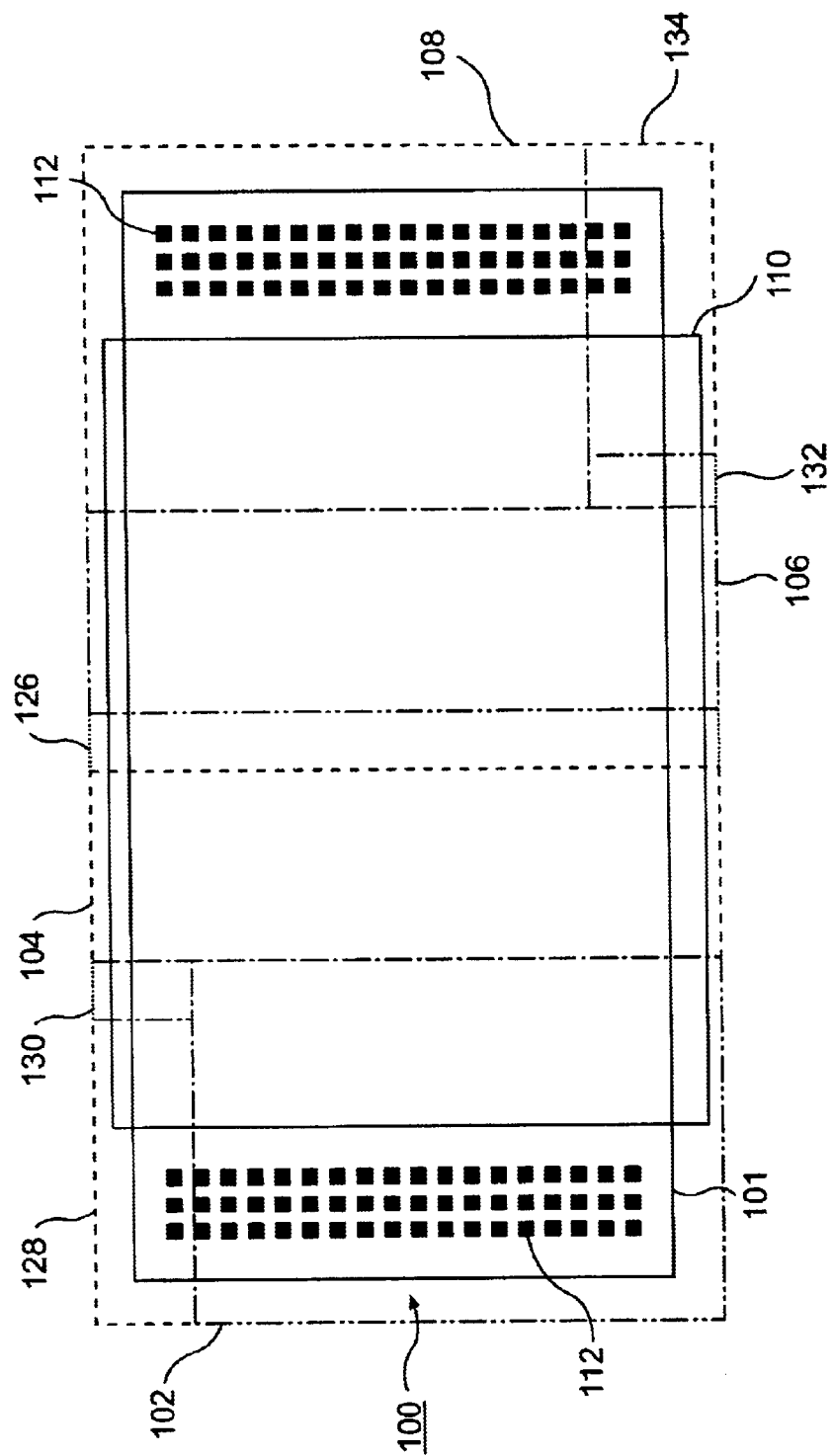
FIG. 7 shows a layout of an SCR structure in accordance with one embodiment of the present invention.

FIG. 7 shows a layout of a PSCR structure in accordance with another embodiment of the present invention. Referring to FIG. 7, the PSCR 100 further includes a third n-type portion 128 and a fourth n-type portion 130. The third n-type portion 128 is contiguous with the first p-type portion 102 and the fourth n-type portion 130, and spaced-apart from the first n-type portion 104. The fourth n-type portion 130 is contiguous with the first p-type portion 102, the first n-type portion 104, and the third n-type portion 128. The third n-type portion 128 has a doped concentration substantially equal to that of the first n-type portion 104 and the second n-type portion 108. The fourth n-type portion 130 has a lower doped concentration than either of the third n-type portion 128 or the first n-type portion 104. The fourth n-type portion 130 may also be undoped. A resistance protection oxide (RPO) layer 110 is formed over the PSCR 100 to prevent polycide growth on the PSCR 100. In operation, the fourth n-type portion 130 provides a resistance, and the third n-type region 128 and the fourth n-type portion 130 provide additional current paths to bias the parasitic bipolar junction transistors when the PSCR 100 is triggered due to an ESD event.

Figure 8:
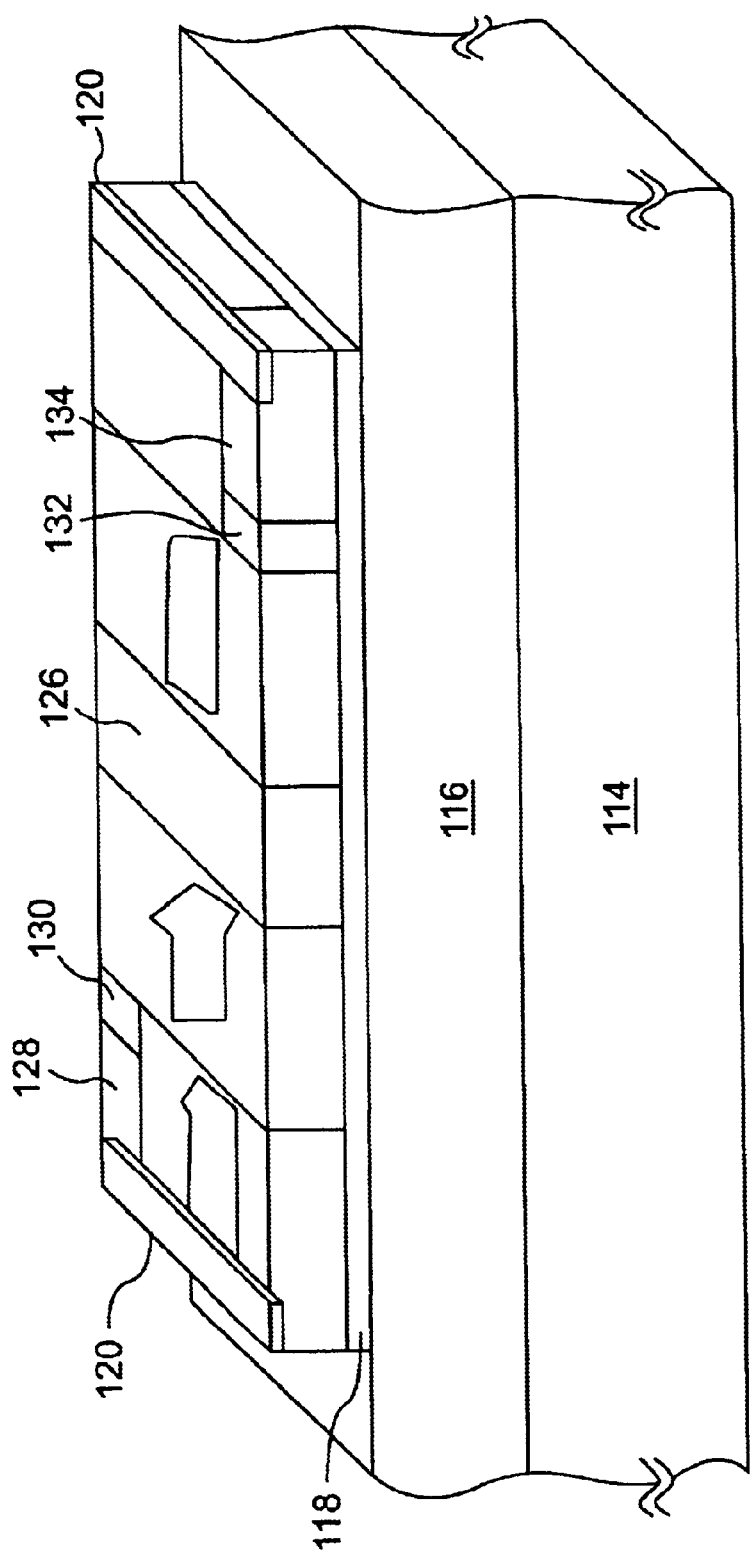
FIG. 8 shows a perspective view of the SCR structure shown in FIG. 7.

The PSCR 100 may further include a third p-type portion 134 and a fourth p-type portion 132. The third p-type portion 134 is contiguous with the second n-type portion 108 and the fourth p-type portion 132, and spaced-apart from the second p-type portion 106. The fourth p-type portion 132 is contiguous with the second p-type portion 106, the second n-type portion 108, and the third p-type portion 134. The third p-type portion 134 has a doped concentration substantially equal to that of the first p-type portion 102 and the second p-type portion 106. The fourth p-type portion 132 has a lower doped concentration than either of the third p-type portion 134 or the second p-type portion 106. The fourth n-type portion 132 may also be undoped. In operation, the fourth p-type portion 132 provides a resistance, and the third p-type portion 134 and the fourth p-type portion 132 provide additional current paths to bias the parasitic bipolar junction transistors when the PSCR 100 is triggered due to an ESD event. FIG. 8 shows a perspective view of the semiconductor structure shown in FIG. 7.

Figure 9:
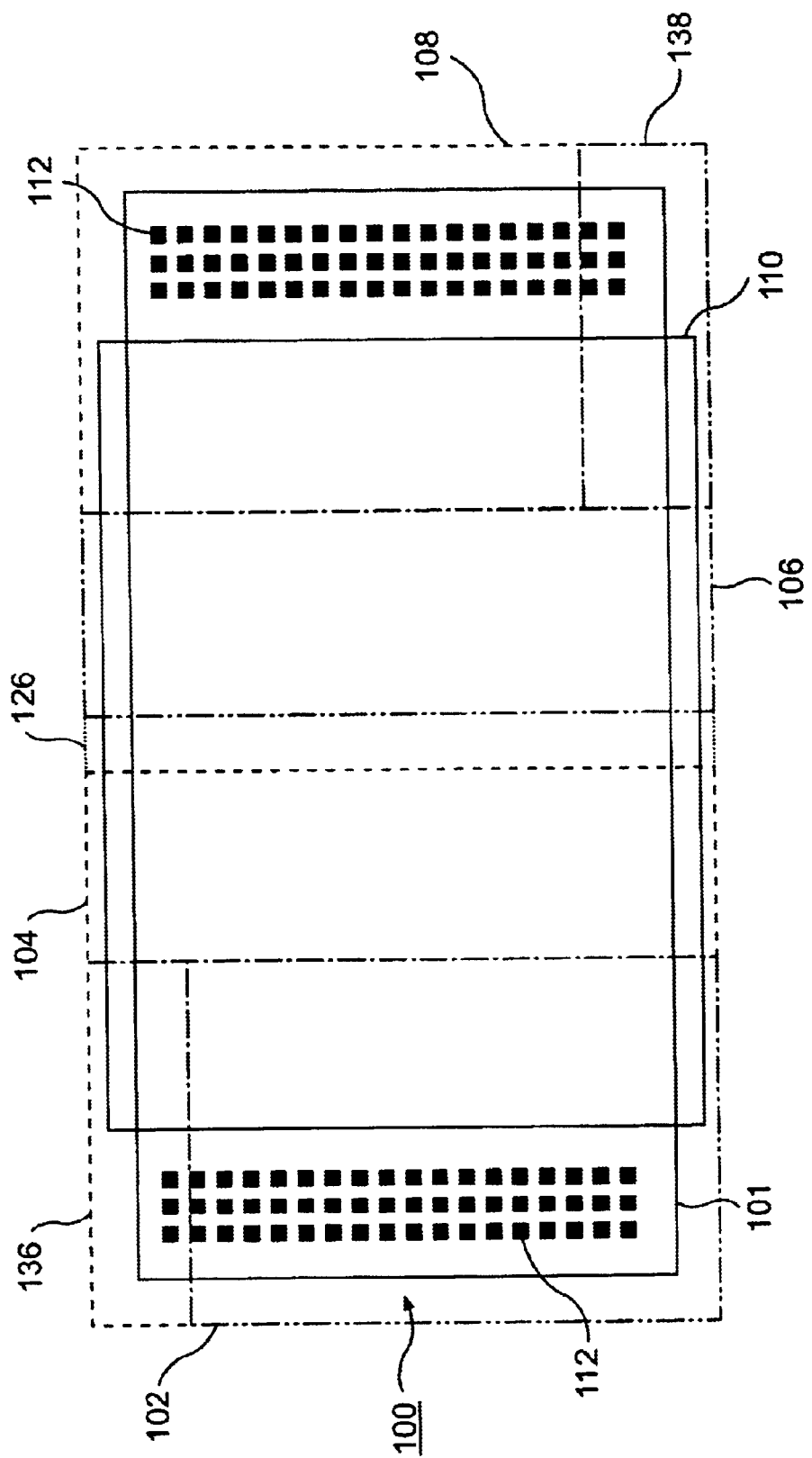
FIG. 9 shows a layout of an SCR structure in accordance with another embodiment of the present invention.
Figure 10:
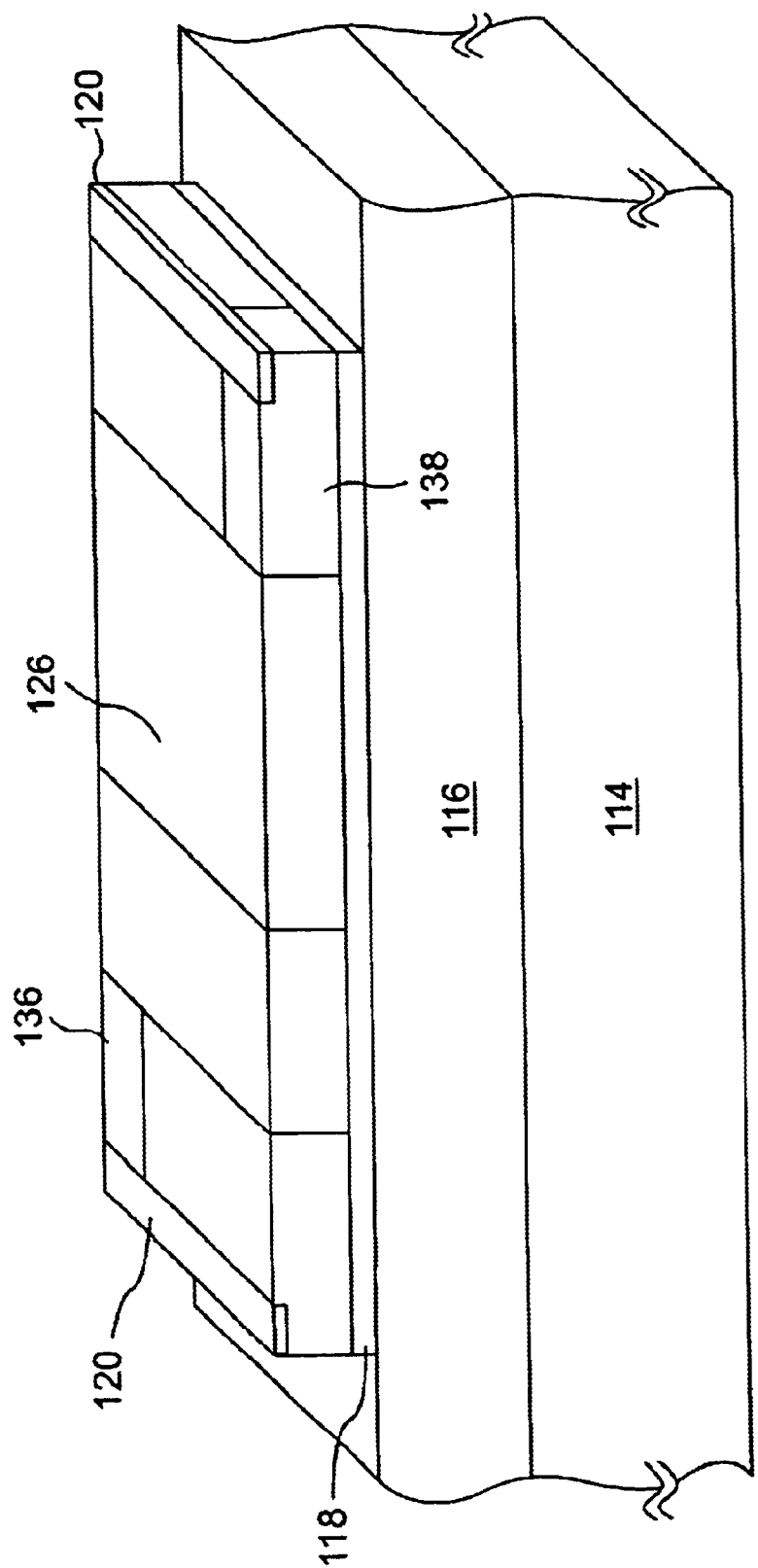
FIG. 10 shows a perspective view of the SCR structure shown in FIG. 9.

FIG. 9 shows a layout of a PSCR structure in accordance with yet another embodiment of the present invention. Referring to FIG. 9, the PSCR 100 shown in FIG. 5 further includes a fifth n-type portion 136 contiguous with the first p-type portion 102 and the first n-type portion 104. The PSCR 100 additionally includes a fifth p-type portion 138 contiguous with the second p-type portion 106 and the second n-type portion 108. The fifth n-type portion 136 has a doped concentration substantially equal to that of the first n-type portion 104 and the second n-type portion 108. The fifth p-type portion 138 has a doped concentration substantially equal to that of the first p-type portion 102 and the second p-type portion 106. FIG. 10 shows a perspective view of the semiconductor structure shown in FIG. 9.

In operation, PSCRs respond to ESD pulses to provide electrostatic discharge protection. Each of the embodiments of the present invention described above may also be controlled by biasing the substrate to improve the trigger speed of the PSCR, or substrate-biased polysilicon SCR (SBPSCR).

Figure 11:
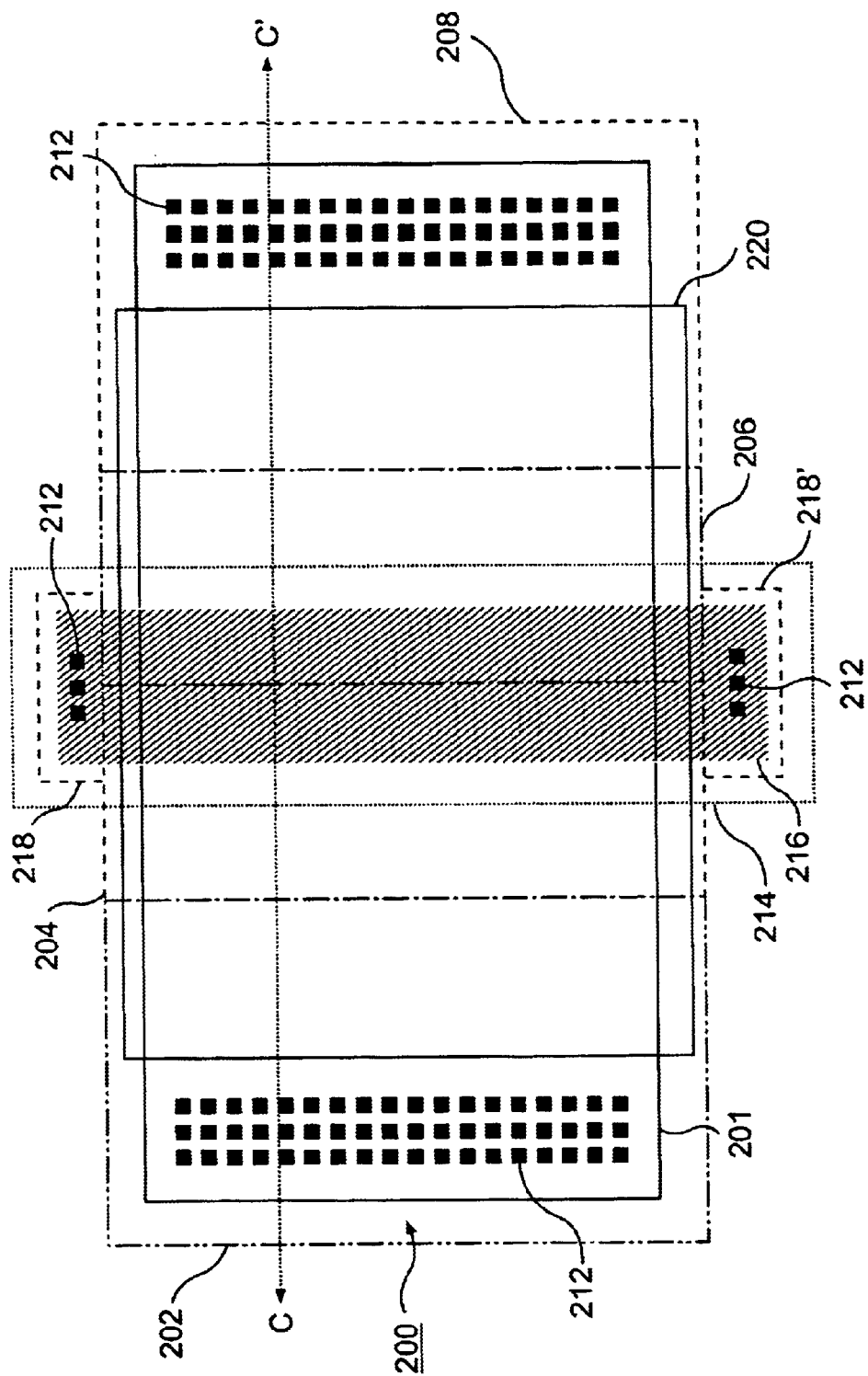
FIG. 11 shows a layout of a substrate-biased SCR structure in accordance with one embodiment of the present invention.

FIG. 11 shows a layout of an SBPSCR structure in accordance with one embodiment of the present invention. Referring to FIG. 11, an SBPSCR 200 includes a first p-type portion 202, a first n-type portion 204 formed contiguous with the first p-type portion 202, a second p-type portion 206 formed contiguous with the first n-type portion 204, and a second n-type portion 208 formed contiguous with the second p-type portion 206. The SBPSCR 200 further includes third n-type regions 218 and 218', each formed contiguous with a portion of the first n-type portion 204 and the second p-type portion 206. Third n-type portions 218 and 218' function as the base of the SBPSCR 200.

The SBPSCR 200 is formed in a polysilicon layer 201 and partially formed over a well region 214. In one embodiment, the well region 214 is an n-type region. The well region 214 include an active region 216, which overlaps a portion of the first n-type portion 204 and the second p-type portion 206. A plurality of contacts 212 connect the first p-type region 202, the second n-type region 208, and the third n-type regions 218 and 218' of the SBPSCR 200. A voltage may be applied to the third n-type regions 218 and 218' to bias the SBPSCR 200 through the contacts 212. A resistance protection oxide (RPO) layer 220 may be formed over the SBPSCR 200 to prevent polycide growth on the SBPSCR 200. The RPO layer 220 does not overlap any of the contacts 212. A cross-sectional view of the SBPSCR 200 along the C–C' direction is shown in FIG. 12.

Figure 12:
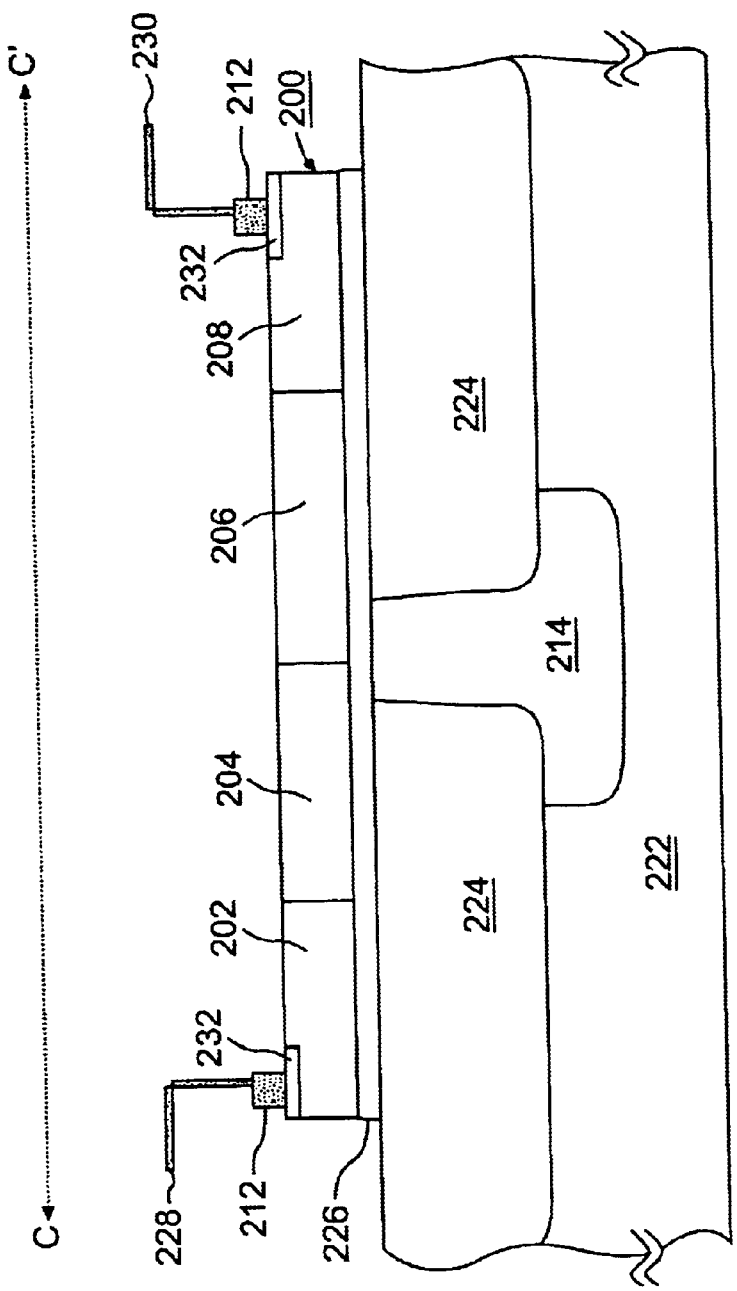
FIG. 12 shows a cross-sectional view of the substrate-biased SCR structure shown in FIG. 11.

Referring to FIG. 12, the SBPSCR 200 is disposed over a dielectric layer 226. The dielectric layer 226 may be a gate dielectric layer and is disposed over STI regions 224 formed in a semiconductor substrate 222. The well region 214 is formed between the STI regions 224 in the semiconductor substrate 222. In one embodiment of the invention, the semiconductor substrate 222 is a p-type substrate. Polycide layers 232 are formed over a portion of the first p-type portion 202 and the second n-type portion 208 of the SBPSCR 200. The contacts 212 are formed over the polycide layers 232 and establish electrical connection with the SBPSCR 200. Specifically, an anode 228 is connected to the first p-type portion 202 of the SBPSCR 200 and a cathode 230 is connected to the second n-type portion 208 of the SBPSCR 200. The SBPSCR 200 is electrically isolated from the semiconductor substrate 222 and therefore immune from substrate noise.

Figure 13:
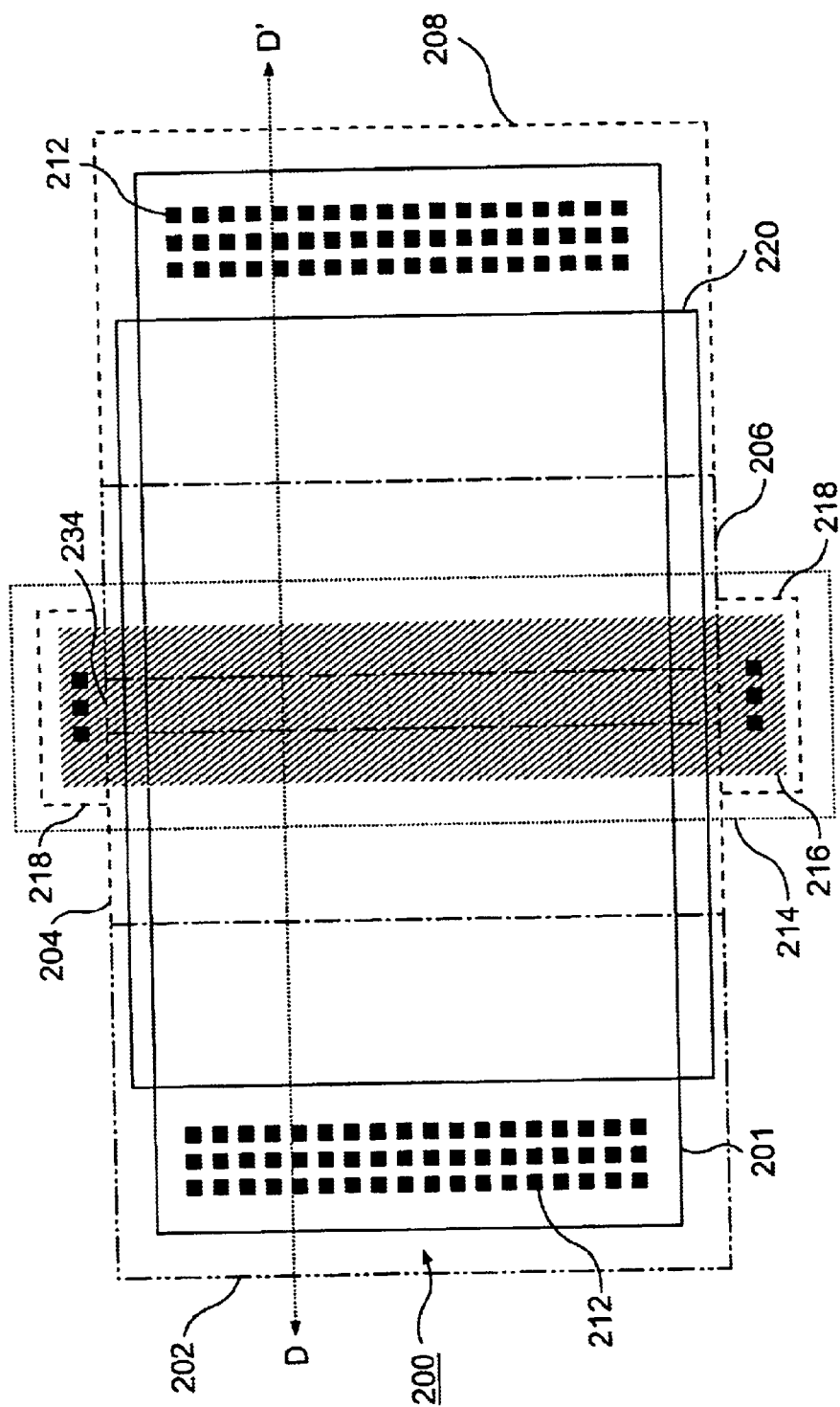
FIG. 13 shows a layout of a substrate-biased SCR structure in accordance with another embodiment of the present invention.
Figure 14:
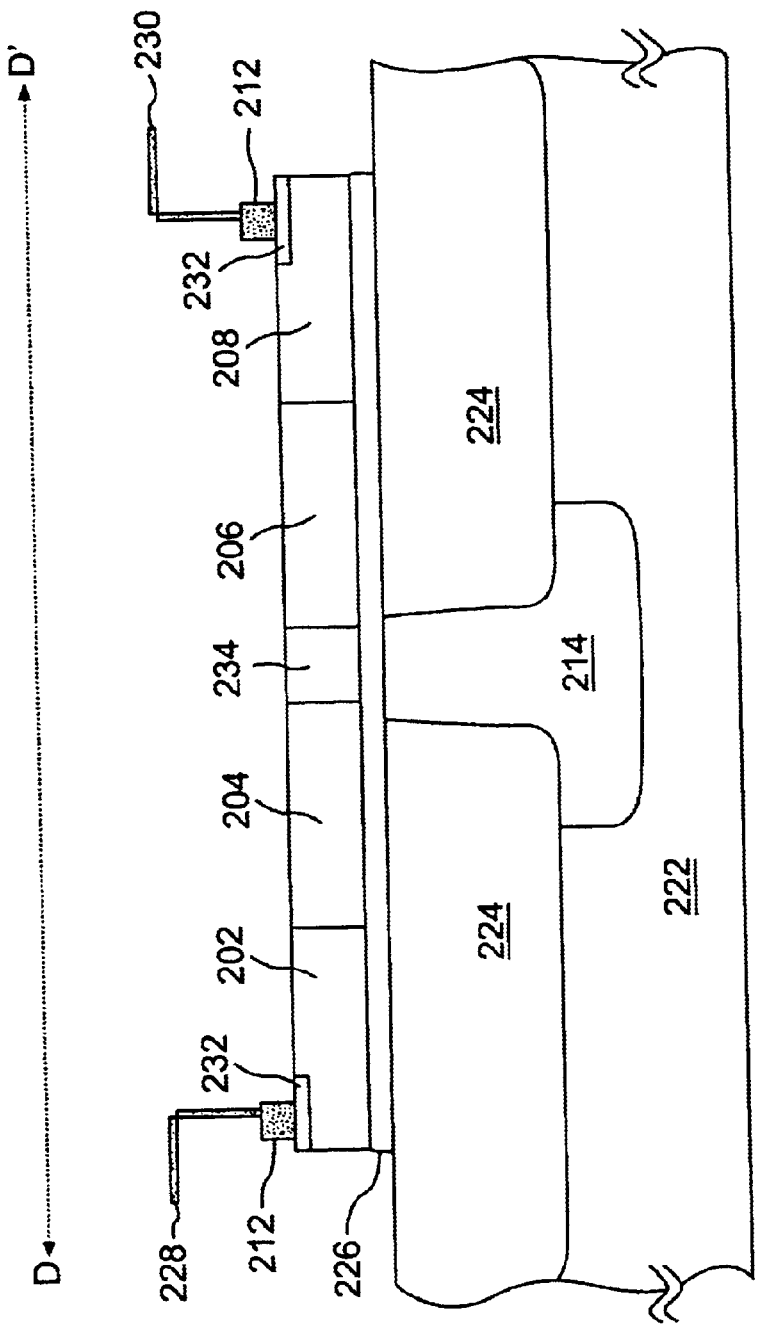
FIG. 14 shows a cross-sectional view of the SCR structure shown in FIG. 13.

FIG. 13 shows a layout of an SBPSCR structure in accordance with another embodiment of the present invention. Referring to FIG. 13, the SBPSCR 200 additionally includes a center portion 234. The center portion 234 is disposed between and contiguous with the first n-type portion 204 and the second p-type portion 206. In one embodiment, the center portion 234 is doped with an n-type dopant and has a doped concentration lower than either of the first n-type portion 204 or the second n-type portion 208. In another embodiment, the center portion 234 is doped with a p-type dopant and has a doped concentration lower than either of the first p-type portion 202 or the second p-type portion 206. In yet another embodiment, the center portion 234 is undoped. The SBPSCR 200 with the center portion 234 suppresses junction leakage current of the SBPSCR 200 due to the difference in dopant concentration levels across the center portion 234. A cross-sectional view of the SBPSCR 200 along the D–D' direction is shown in FIG. 14.

Figure 15:
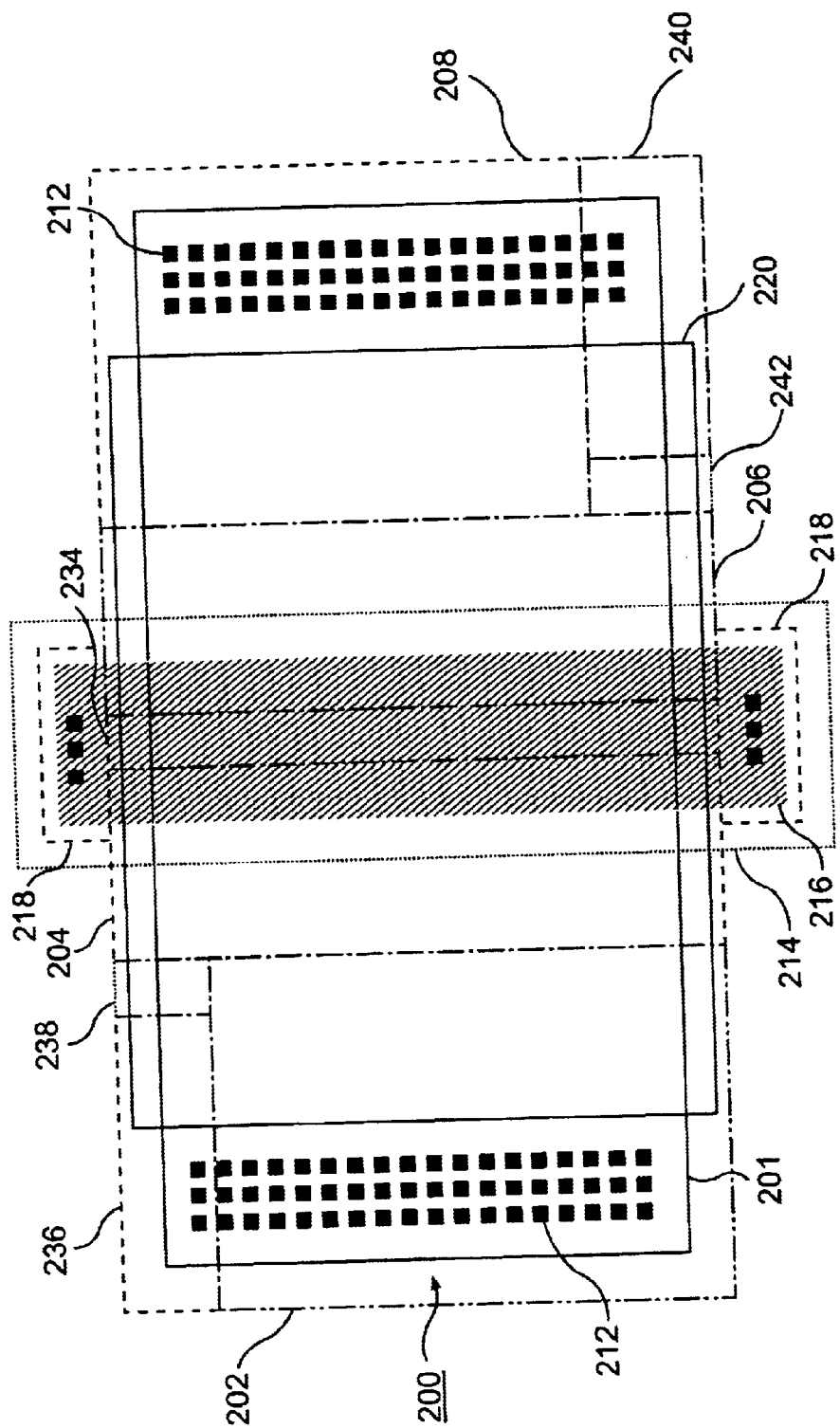
FIG. 15 shows a layout of a substrate-biased SCR structure in accordance with another embodiment of the present invention.

FIG. 15 shows a layout of an SBPSCR structure in accordance with another embodiment of the present invention. Referring to FIG. 15, the SBPSCR 200 further includes a fourth n-type portion 236 and a fifth n-type portion 238. The fourth n-type portion 236 is contiguous with the first p-type portion 202 and the fifth n-type portion 238, and spaced-apart from the first n-type portion 204. The fifth n-type portion 238 is contiguous with the first p-type portion 202, the first n-type portion 204, and the fourth n-type portion 236. The fourth n-type portion 236 has a doped concentration substantially equal to that of the first n-type portion 204 and the second n-type portion 208. The fifth n-type portion 238 has a lower doped concentration than either of the fourth n-type portion 236 or the first n-type portion 204. The fifth n-type portion 238 may also be undoped. In operation, the fifth n-type portion 238 provides a resistance, and the fourth n-type region 236 and the fifth n-type portion 238 provide additional current paths to bias the parasitic bipolar junction transistors when the SBPSCR 200 is triggered due to an ESD event.

Figure 16:
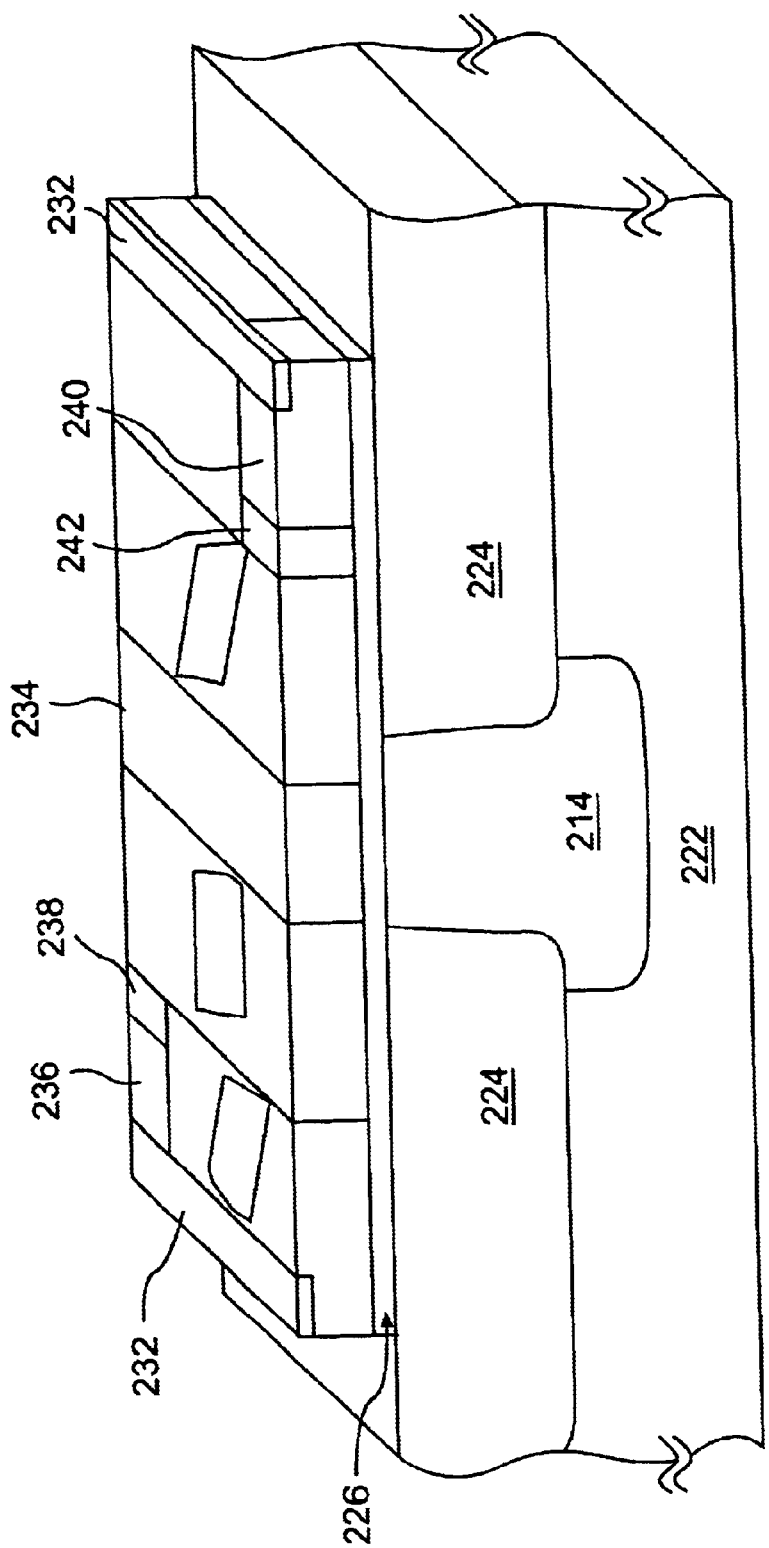
FIG. 16 shows a perspective view of the SCR structure shown in FIG. 15.

The SBPSCR 200 may further include a third p-type portion 240 and a fourth p-type portion 242. The third p-type portion 240 is contiguous with the second n-type portion 208 and the fourth p-type portion 242, and is spaced-apart from the second p-type portion 206. The fourth p-type portion 242 is contiguous with the second p-type portion 206, the second n-type portion 208, and the third p-type portion 240. The third p-type portion 240 has a doped concentration substantially equal to that of the first p-type portion 202 and the second p-type portion 206. The fourth p-type portion 242 has a lower doped concentration than either of the third p-type portion 240 or the second p-type portion 206. The fourth n-type portion 242 may also be undoped. In operation, the fourth p-type portion 242 provides a resistance, and the third p-type portion 240 and the fourth p-type portion 242 provide additional current paths to bias the parasitic bipolar junction transistors when the SBPSCR 200 is triggered due to an ESD event. FIG. 8 shows a prospective view of the semiconductor structure shown in FIG. 16.

Figure 17:
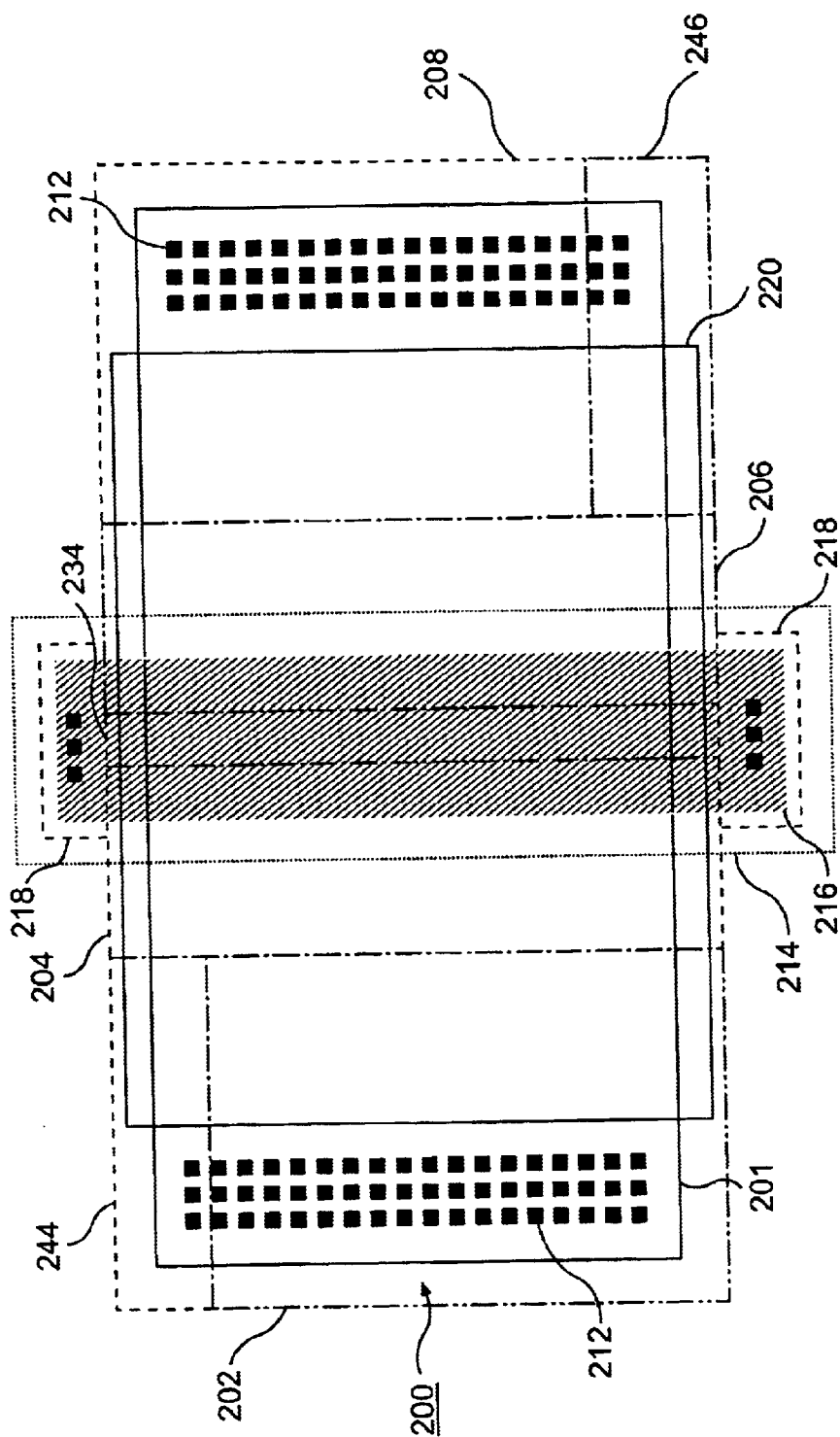
FIG. 17 shows a layout of a substrate-biased SCR structure in accordance with another embodiment of the present invention.
Figure 18:
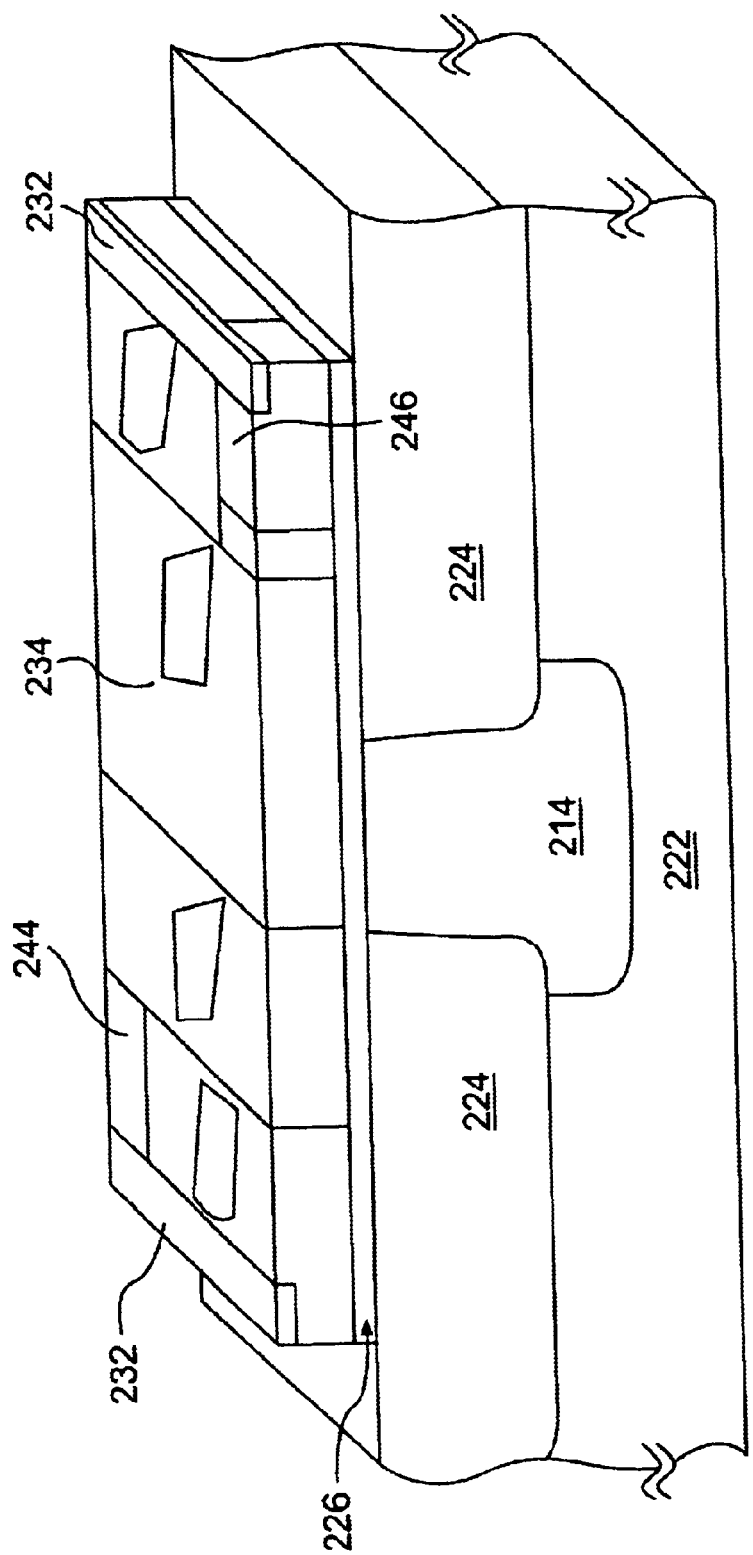
FIG. 18 shows a perspective view of the SCR structure shown in FIG. 17.

FIG. 17 shows a layout of an SBPSCR structure in accordance with yet another embodiment of the present invention. Referring to FIG. 17, the SBPSCR 200 shown in FIG. 13 further includes a sixth n-type portion 244 contiguous with the first p-type portion 202 and the first n-type portion 204. The SBPSCR 200 additionally includes a fifth p-type portion 246 contiguous with the second p-type portion 206 and the second n-type portion 208. The sixth n-type portion 244 has a doped concentration substantially equal to that of the first n-type portion 204 and the second n-type portion 208. The fifth p-type portion 246 has a doped concentration substantially equal to that of the first p-type portion 202 and the second p-type portion 206. FIG. 18 shows a prospective view of the semiconductor structure shown in FIG. 17.

In operation, SBPSCR 200 responds to ESD pulses to provide electrostatic discharge protection. Furthermore, each of the well region 214 can be biased through the base, or one of the n-type portions 218 and 218', to control the SBPSCR 200 for providing electrostatic discharge protection.

The PSCR and SBPSCR of the present invention may also be implemented in a silicon-on-insulator (SOI) CMOS integrated circuit. As is known, an insulator is disposed over a semiconductor substrate. The PSCR or SBPSCR of the present invention is then formed over the insulator inside a silicon or polysilicon layer, with each of the embodiments described above. In operation, the insulator isolates devices in an SOI integrated circuit. Therefore, a method to protect a silicon-on-insulator device from electrostatic discharge includes providing a signal to the device through an SOI circuit. A low-noise silicon controlled rectifier is then provided in the SOI circuit and isolated from a substrate of the SOI circuit. The polysilicon controlled rectifier then protects the SOI device from electrostatic discharge.

Figure 19:
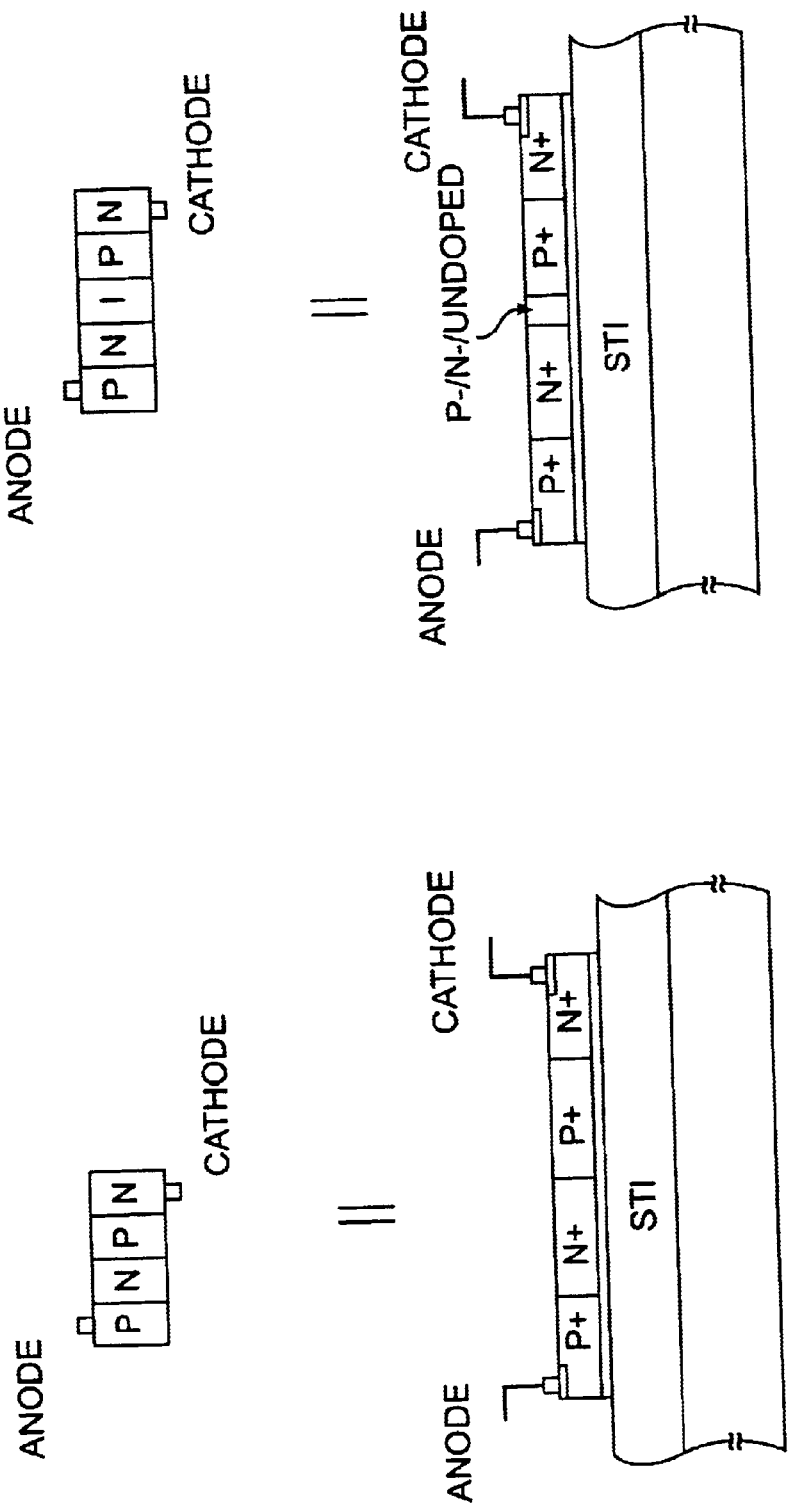
FIG. 19 shows the circuit symbols for PSCR structures relative to the cross-sectional views of the PSCR structures.
Figure 20:
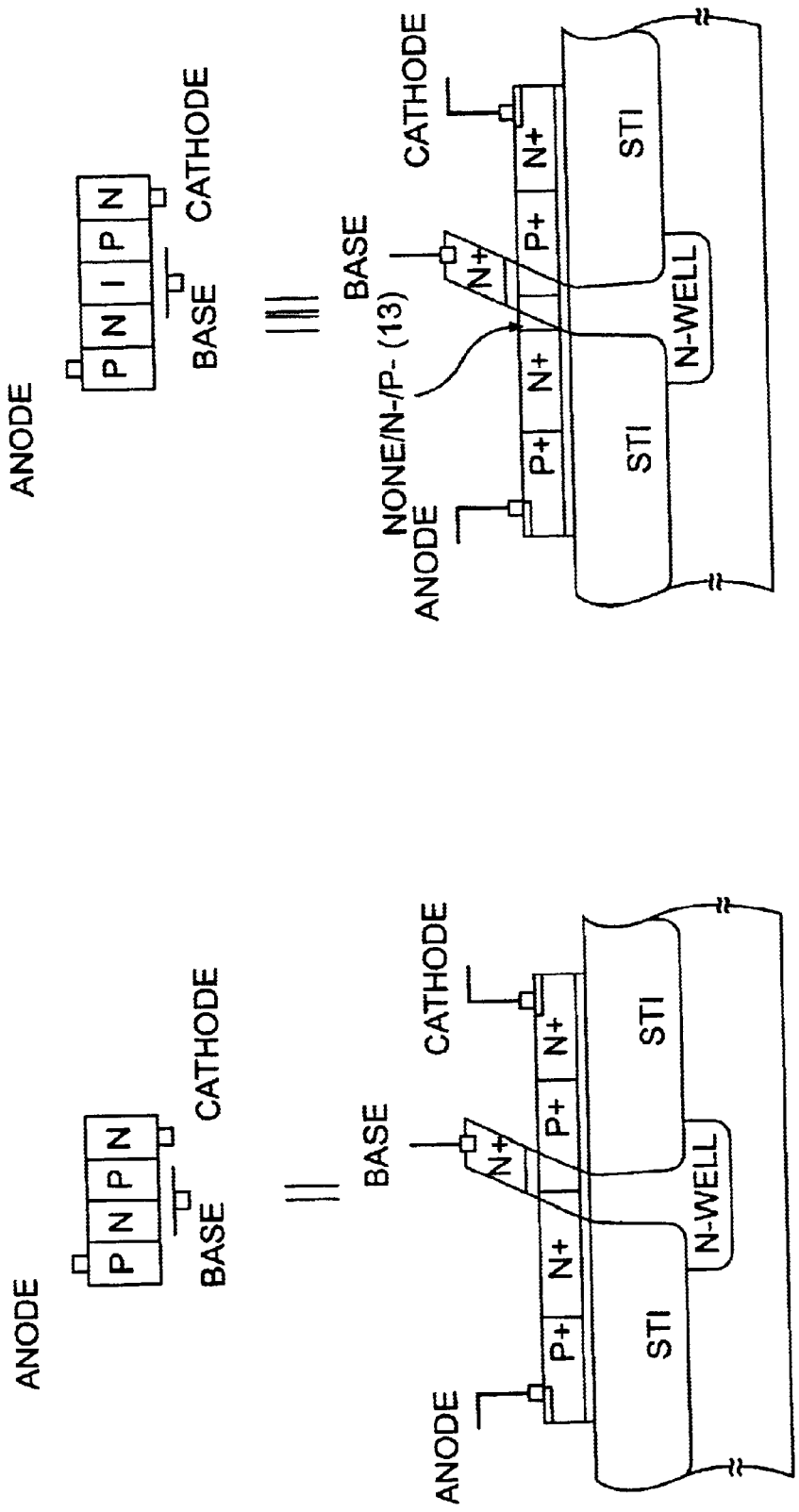
FIG. 20 shows the circuit symbols for SBPSCR structures relative to the cross-sectional views of the SBPSCR structures.

FIG. 19 shows the circuit symbols for a PSCR as shown in FIG. 3 and a PSCR as shown in FIG. 5. FIG. 20 shows the circuit symbols for an SBPSCR shown in FIG. 11 and an SBPSCR as shown in FIG. 13.

Figure 21:
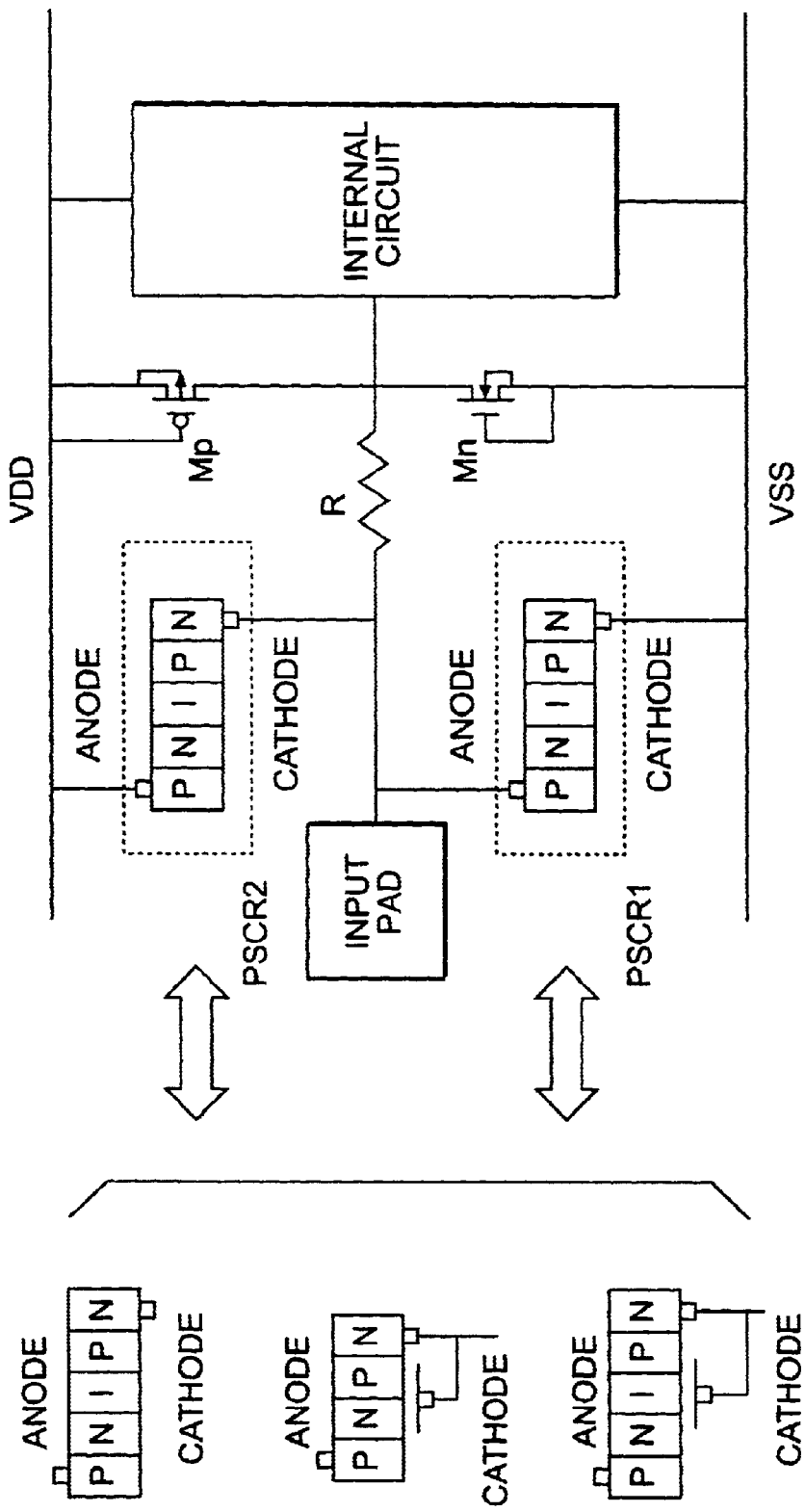
FIG. 21 is a circuit diagram of an ESD protection circuit with two PSCRs.

FIG. 21 is a circuit diagram of an ESD protection circuit with two PSCRs. Referring to FIG. 21, during an ESD event, with Vss being relatively grounded, transistor Mn is triggered during an early stage of the ESD event and conducts an early ESD current to ground. Subsequently, the ESD current increases. Through a transistor R, the ESD current raises the voltage level on an anode of PSCR1. When the voltage across the PSCR1 reaches a level that triggers the PSCR1, PSCR1 is triggered into a voltage holding region and bypasses the high level ESD current to ground, thereby protecting the internal circuit.

Figure 22:
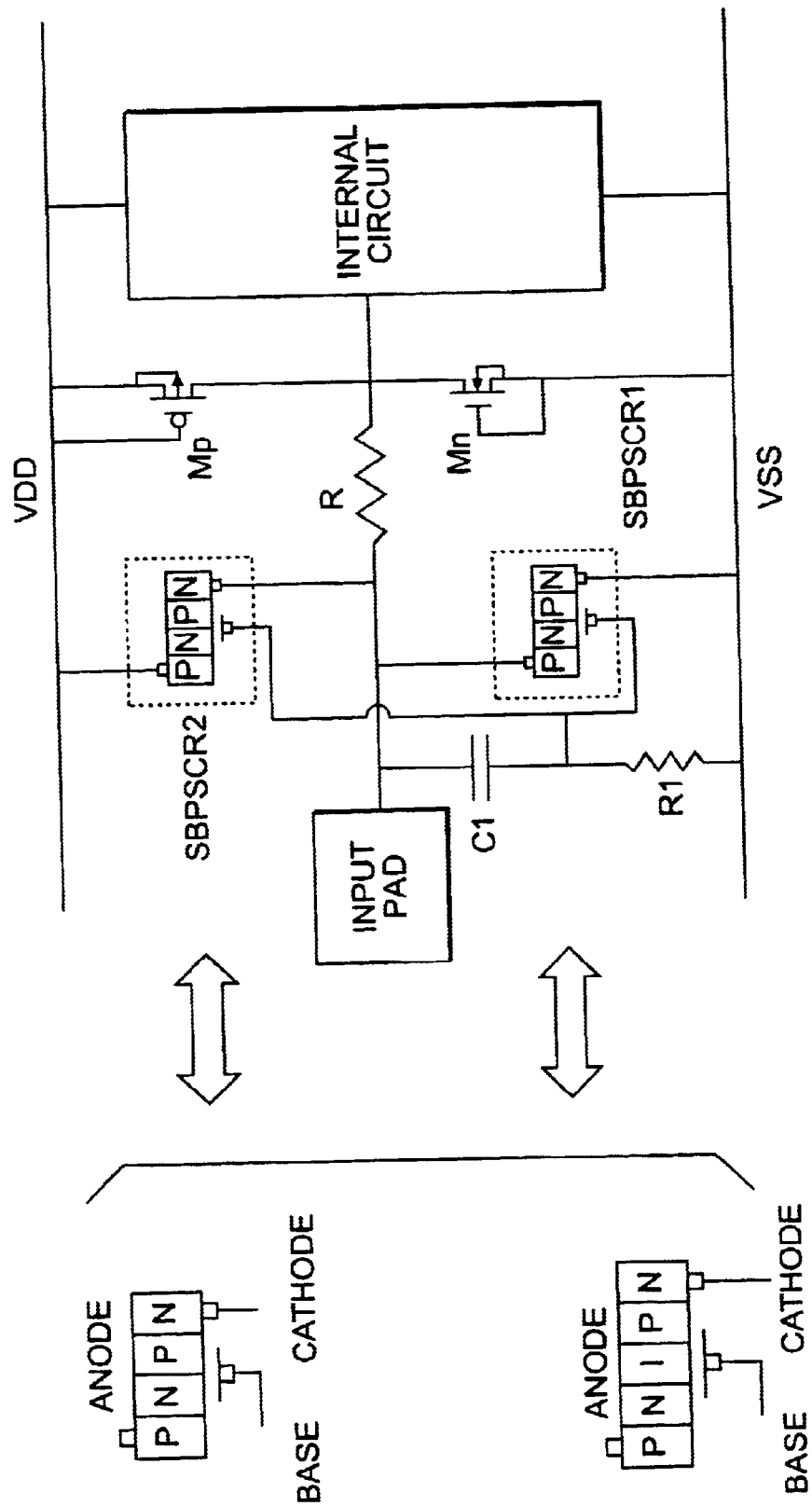
FIG. 22 is a circuit diagram of an ESD protection circuit with two SBPSCRs.

FIG. 22 is a circuit diagram of an ESD protection circuit with two SBPSCRs. Referring to FIG. 22, with substrate-biasing, the SBPSCR 1 and SBPSCR 2 shown in FIG. 22 has a lower trigger voltage than those PSCRs shown in FIG. 21. During normal operations, both SBPSCR 1 and SBPSCR 2 are biased to ground to eliminate any leakage current. During an ESD event releasing a positive ESD current relative to Vss, the SBPSCR1 is biased at a high positive voltage level and the trigger voltage is reduced. SBPSCR1 conducts the ESD current to ground. During an ESD event releasing a negative ESD current relative to $V_{DD}$, the SBPSCR2 will be biased at a high negative voltage level and the trigger voltage is reduced. SBPSCR1 conducts the ESD current to ground.

Each of the circuits shown in FIGS. 21 and 22 may be implemented with a clamp circuit having an RC delay constant to be able to detect an ESD event within microseconds.

Therefore, the present invention also includes a method for protecting a CMOS semiconductor device from electrostatic discharge. The method provides a signal to the device through a CMOS circuit and a low-noise silicon controlled rectifier in the complementary metal-oxide semiconductor circuit. The low-noise silicon controlled rectifier is isolated from a substrate of the CMOS device. The low-noise silicon controlled rectifier may be biased to provide electrostatic discharge protection from the signal.

It will be apparent to those skilled in the art that various modifications and variations can be made in the disclosed process without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. An integrated circuit device, comprising:
   a semiconductor substrate;
   a dielectric layer disposed over the semiconductor substrate;
   a layer of silicon, formed over the dielectric layer, including a first p-type portion, a first n-type portion contiguous with the first p-type portion, a second p-type portion, and a second n-type portion contiguous with the second p-type portion; and
   an isolation structure formed inside the semiconductor substrate and being in contact with the dielectric layer wherein the first p-type portion, the second p-type portion, the first n-type portion, and the second n-type portion overlap the isolation structure.

2. The integrated circuit device as claimed in claim 1, wherein the first n-type portion is contiguous with the second p-type portion.

3. An integrated circuit device, comprising:
   a semiconductor substrate;
   a dielectric layer disposed over the semiconductor substrate; and
   a layer of silicon, formed over the dielectric layer, including a first p-type portion, a first n-type portion contiguous with the first p-type portion, a second p-type portion, a second n-type portion contiguous with the second p-type portion, and a center portion disposed between the first n-type portion and the second p-type portion, wherein the first n-type portion is spaced apart from the second p-type portion.

4. The integrated circuit device as claimed in claim 3, wherein the center portion of the layer of silicon is doped with an n-type impurity having a doped concentration lower than one of the first n-type portion and second n-type portion.

5. The integrated circuit device as claimed in claim 3, wherein the center portion of the layer of silicon is doped with a p-type impurity having a doped concentration lower than one of the first p-type portion and second p-type portion.

6. The integrated circuit device as claimed in claim 3, wherein the center portion of the layer of silicon is undoped.

7. The integrated circuit device as claimed in claim 3, further comprising an isolation structure formed inside the semiconductor substrate and being in contact with the dielectric layer wherein the first p-type portion, the second p-type portion, the first n-type portion, and the second n-type portion overlap the isolation structure.

8. An integrated circuit device, comprising:
   a semiconductor substrate;
   a dielectric layer disposed over the semiconductor substrate; and
   a layer of silicon, formed over the dielectric layer, including a first p-type portion, a first n-type portion contiguous with the first p-type portion, a second p-type portion, a second n-type portion contiguous with the second p-type portion, and a third n-type portion contiguous with the first p-type portion,
   wherein the first p-type portion and the second p-type portion are contiguous with the dielectric layer.

9. The integrated circuit device as claimed in claim 8, wherein the layer of silicon further comprises a fourth n-type portion contiguous with the first p-type portion and the first n-type portion, wherein the fourth n-type portion has a doped concentration lower than that of the third n-type portion.

10. The integrated circuit device as claimed in claim 8, wherein the third n-type portion is contiguous with the first n-type portion.

11. The integrated circuit device as claimed in claim 8, wherein the third n-type portion is spaced-apart from the first n-type portion.

12. The integrated circuit device as claimed in claim 8, further comprising an isolation structure formed inside the semiconductor substrate and being in contact with the dielectric layer wherein the first p-type portion, the second p-type portion, the first n-type portion, and the second n-type portion overlap the isolation structure.

13. An integrated circuit device, comprising:
   a semiconductor substrate;
   a dielectric layer disposed over the semiconductor substrate; and
   a layer of silicon, formed over the dielectric layer, including a first p-type portion, a first n-type portion contiguous with the first p-type portion, a second p-type portion, a second n-type portion contiguous with the second p-type portion, and a third p-type portion contiguous with the second n-type portion,
   wherein the first n-type portion and the second n-type portion are contiguous with the dielectric later.

14. The integrated circuit device as claimed in claim 13, wherein the layer of silicon further comprises a fourth p-type portion contiguous with the second n-type portion, wherein the fourth p-type portion has a doped concentration lower than that of the third p-type portion.

15. The integrated circuit device as claimed in claim 13, wherein the third p-type portion is contiguous with the second p-type portion.

16. The integrated circuit device as claimed in claim 13, wherein the third p-type portion is spaced-apart from the second p-type portion.

17. The integrated circuit device as claimed in claim 13, further comprising an isolation structure formed inside the semiconductor substrate and being in contact with the dielectric layer wherein the first p-type portion, the second p-type portion, the first n-type portion, and the second n-type portion overlap the isolation structure.

18. An integrated circuit device, comprising
a semiconductor substrate;
an isolation structure formed inside the semiconductor substrate; and
a layer of silicon, formed over the isolation structure, including a first p-type portion, a first n-type portion contiguous with the first p-type portion, a center portion contiguous with the first n-type portion, a second p-type portion contiguous with the center portion, and a second n-type portion contiguous with the second p-type portion, wherein the first p-type portion, the second p-type portion, the center portion, the first n-type portion, and the second n-type portion overlap the isolation structure.

19. The integrated circuit device as claimed in claim 18, wherein the center portion of the layer of silicon is doped with an n-type impurity having a doped concentration lower than that of the first n-type portion.

20. The integrated circuit device as claimed in claim 18, wherein the center portion of the layer of silicon is doped with a p-type impurity having a doped concentration lower than that of the first p-type portion.

21. The integrated circuit device as claimed in claim 18, wherein the center portion of the layer of silicon is undoped.

22. The integrated circuit device as claimed in claim 18, wherein the layer of silicon further comprises a third n-type portion contiguous with the first p-type portion.

23. The integrated circuit device as claimed in claim 22, wherein the layer of silicon further comprises a fourth n-type portion contiguous with the first p-type portion and the first n-type portion, wherein the fourth n-type portion has a doped concentration lower than that of the third n-type portion.

24. The integrated circuit device as claimed in claim 18, wherein the layer of silicon further comprises a third p-type portion contiguous with the second n-type portion.

25. The integrated circuit device as claimed in claim 24, wherein the layer of silicon further comprises a fourth p-type portion contiguous with the second n-type portion, wherein the fourth p-type portion has a doped concentration lower than that of the third p-type portion, and wherein the third p-type portion is spaced-apart from the second p-type portion.

26. An integrated circuit device, comprising
a semiconductor substrate;
a well region formed inside the semiconductor substrate;
a first isolation structure, formed inside the semiconductor substrate, contiguous with the well region;
a second isolation structure, formed inside the semiconductor substrate, contiguous with well region and spaced apart from the first isolation structure;
a dielectric layer disposed over the well region and the first and second isolation structures; and
a layer of silicon, formed over the dielectric layer, including a first p-type portion, a first n-type portion contiguous with the first p-type portion, a second p-type portion, and a second n-type portion contiguous with the second p-type portion, wherein at least a portion of the first p-type and first n-type portions overlap the first isolation structure and at least a portion of the second p-type and second n-type portions overlap the second isolation structure.

27. The integrated circuit device as claimed in claim 26, wherein the first n-type portion is contiguous with the second p-type portion.

28. The integrated circuit device as claimed in claim 26, wherein the layer of silicon further comprises a center portion disposed between the first n-type portion and the second p-type portion, wherein the center portion overlaps the well region.

29. The integrated circuit device as claimed in claim 28, wherein the center portion of the layer of silicon is undoped.

30. The integrated circuit device as claimed in claim 28, wherein the center portion of the layer of silicon is doped with an n-type impurity.

31. The integrated circuit device as claimed in claim 28, wherein the center portion of the layer of silicon is doped with a p-type impurity.

32. The integrated circuit device as claimed in claim 26, wherein the layer of silicon further comprises a third n-type portion contiguous with the first p-type portion.

33. The integrated circuit device as claimed in claim 32, wherein the layer of silicon further comprises a fourth n-type portion contiguous with the first p-type portion and the first n-type portion, wherein the fourth n-type portion has a doped concentration lower than that of the third n-type portion.

34. The integrated circuit device as claimed in claim 32, wherein the third n-type portion is contiguous with the first n-type portion.

35. The integrated circuit device as claimed in claim 32, wherein the third n-type portion is spaced-apart from the first n-type portion.

36. The integrated circuit device as claimed in claim 26, wherein the layer of silicon further comprises a third p-type portion contiguous with the second n-type portion.

37. The integrated circuit device as claimed in claim 36, wherein the layer of silicon further comprises a fourth p-type portion contiguous with the second n-type portion, wherein the fourth p-type portion has a doped concentration lower than that of the third p-type portion, and wherein the third p-type portion is spaced-apart from the second p-type portion.

38. The integrated circuit device as claimed in claim 26, wherein the well region is biased to control the layer of silicon for providing electrostatic discharge protection.

39. The integrated circuit device as claimed in claim 26, wherein the first p-type portion is coupled to a $V_{DD}$ signal.

40. The integrated circuit device as claimed in claim 26, wherein the second n-type portion is coupled to a $V_{SS}$ signal.

41. An integrated circuit device, comprising:
a semiconductor substrate;
an insulator layer disposed over the semiconductor substrate;
a first silicon layer disposed over the insulator layer, including
a first isolation structure formed inside the first silicon layer, and
a second isolation structure formed inside the first silicon layer and spaced apart from the first isolation structure;
a dielectric layer disposed over the first silicon layer; and
a second layer of silicon, disposed over the dielectric layer, including a first p-type portion, a first n-type portion contiguous with the first p-type portion, a second p-type portion, and a second n-type portion contiguous with the second p-type portion.

42. The integrated circuit device as claimed in claim 41, wherein the portion of the first silicon layer between the first and second isolation structures is biased to provide electrostatic discharge protection.

43. The integrated circuit device as claimed in claim 41, wherein the second layer of silicon further comprises a center portion disposed between the first n-type portion and the second p-type portion.

44. The integrated circuit device as claimed in claim 43, wherein the center portion of the layer of silicon is doped with an n-type impurity having a doped concentration lower than one of the first n-type portion and second n-type portion.

45. The integrated circuit device as claimed in claim 43, wherein the center portion of the layer of silicon is doped with a p-type impurity having a doped concentration lower than one of the first p-type portion and second p-type portion.

46. The integrated circuit device as claimed in claim 43, wherein the center portion of the layer of silicon is undoped.

* * * * *